US009922892B2

(12) United States Patent
Lin

(10) Patent No.: US 9,922,892 B2
(45) Date of Patent: Mar. 20, 2018

(54) METHOD AND APPARATUS FOR BOND-PAD CHARGING PROTECTION OF TRANSISTOR TEST STRUCTURES

(71) Applicant: Wallace W Lin, San Jose, CA (US)

(72) Inventor: Wallace W Lin, San Jose, CA (US)

( * ) Notice: Subject to any disclaimer, the term of this patent is extended or adjusted under 35 U.S.C. 154(b) by 1 day.

(21) Appl. No.: 15/146,863

(22) Filed: May 4, 2016

(65) Prior Publication Data

US 2016/0329258 A1    Nov. 10, 2016

Related U.S. Application Data

(60) Provisional application No. 62/179,234, filed on May 4, 2015.

(51) Int. Cl.
*H01L 21/00* (2006.01)
*H01L 21/66* (2006.01)
*H01L 27/02* (2006.01)
*H01L 27/098* (2006.01)
*H01L 23/66* (2006.01)

(52) U.S. Cl.
CPC .............. *H01L 22/34* (2013.01); *H01L 23/66* (2013.01); *H01L 27/0266* (2013.01); *H01L 27/098* (2013.01); *H01L 2223/6677* (2013.01)

(58) Field of Classification Search
CPC ..... H01L 23/34; H01L 23/66; H01L 27/0266; H01L 27/098; H01L 2223/6677
USPC ....... 257/355, 489, 536, 632, 642, 650, 750; 438/14
See application file for complete search history.

(56) References Cited

U.S. PATENT DOCUMENTS 6,064,094 A * 5/2000 Intrater ................... H01L 23/62
                                                      257/355
2003/0164508 A1* 9/2003 Hou ..................... H01L 27/0262
                                                      257/173

OTHER PUBLICATIONS

Wallace Lin, "A New Technique for Measuring Gate Oxide Leakage in Charging Protected MOSFETs," IEEE Trans. Electron Devices. vol. 54, No. 4, pp. 683-691, 2007, USA.
W. Lin and G. Sery, "A Gate Charging Model for ILD Related Plasma Process in MOSFETs," IEEE Electron Device Letter, p. 10, Jan. 2003, USA.

* cited by examiner

*Primary Examiner* — Brook Kebede

(57) ABSTRACT

A method for preparing a non-reference transistor test structure having multiple terminals is disclosed. The method may include when an intended application of the non-reference transistor test structure is not for monitoring a plasma-involved charging, employing a protection mechanism by placing the MOSFET-based gated diode at a first metal layer, wherein the first metal layer is a lowermost metal layer, and when the intended application of the non-reference transistor test structure is for monitoring a plasma-involved charging, placing a charging monitoring antenna at a second metal layer; and employing the protection mechanism by placing a MOSFET-based gated diode at one metal layer above the second metal layer.

19 Claims, 23 Drawing Sheets

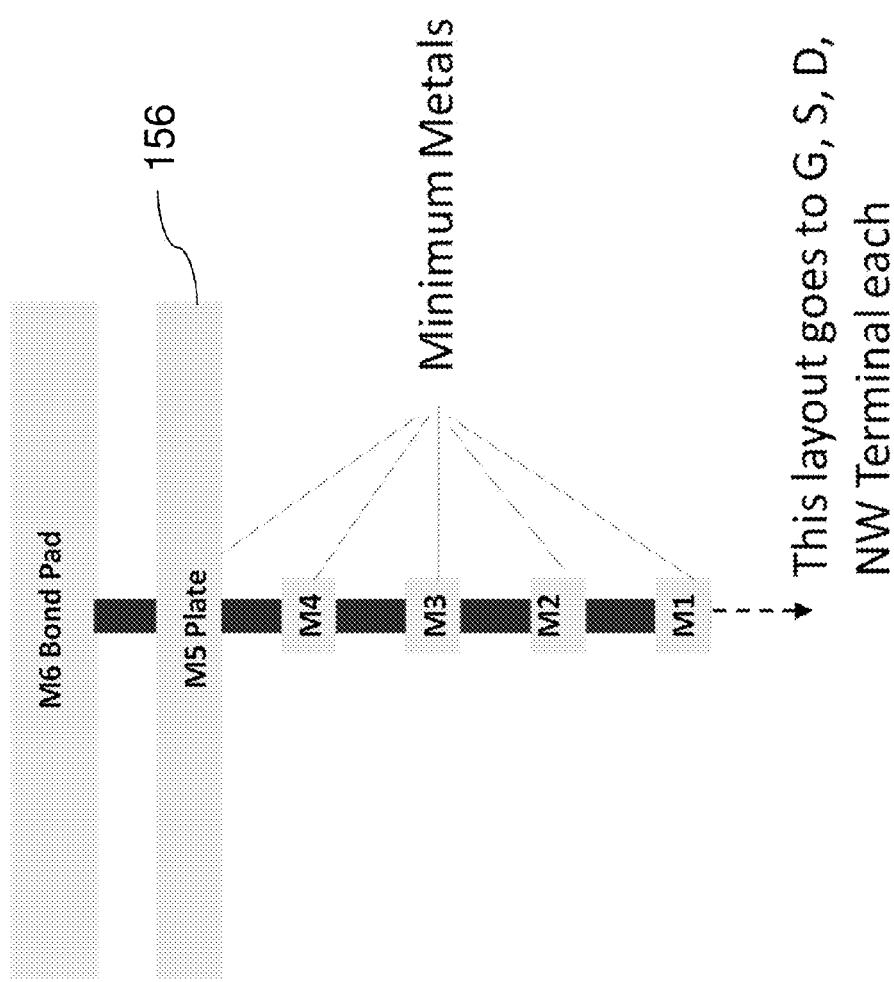

| TBPLBP | M1 | M2 | M3 | M4 | M5 | NO |
|---|---|---|---|---|---|---|
| M1 | X | | | | | X |
| M2 | X | X | | | | X |
| M3 | X | X | X | | | X |
| M4 | X | X | X | X | | X |
| M5 | X | X | X | X | X | X |
| M6 | X | X | X | X | | X |

Fig. 2

| Group | $V_G$ | $V_S$ | $V_D$ | $V_C$ | $V_{NW}$ | $V_{GS}$ | $V_{GD}$ | $V_{GC}$ | $V_{GNW}$ |
|---|---|---|---|---|---|---|---|---|---|
| #1 | -0.37 | -6.37 | -6.37 | ~0 | 0 | 6 | 6 | ~-0.37 | -0.37 |
| #2 | -0.37 | -0.37 | -0.37 | ~-0.37 | 0 | 0 | 0 | 0 | -0.37 |

Fig. 6

| Charging-Monitoring Non-Reference Transistor Test Structures | | |
|---|---|---|
| Method | #1<br>1-PD | #2<br>4-PD |
| Charging Monitoring Antenna @Metal Layer | $M_X$ | $M_X$ |
| Number of PD | 1 | 4 |
| PD @ Metal Layer | $M_{X+1}$ | $M_{X+1}$ |
| PD @Terminal | G, S, D, NW | G, S, D, NW |
| Number of Fuse | 4 | 0 |
| Number of Fuse Pad | 1 | 0 |
| Global PD Turn-off Allowed | NO | YES |
| Number of TIL Pad | 0 | 0 |
| TIL Pad @ Metal Layer | NA | NA |
| TIL Pad @Terminal | NA | NA |
| Number of TIL Pad Jumper | 0 | 0 |
| TIL Pad Jumper @ Metal Layer | NA | NA |
| Inline Pad Allowed | NO | At any one or any more metal layers above $M_X$ and below bond pad ayer, up to total N -X-1 layers |

Fig. 10(a)

| Non-Charging-Monitoring Non-Reference Transistor Test Structures | | | |
|---|---|---|---|
| Method | #1<br>1-PD | #2<br>4-PD | #3<br>1-PD + TIL* Pad of Full Bond-Pad Size |
| Charging Monitoring Antenna @Metal Layer | NA | NA | NA |
| Number of PD | 1 | 4 | 1 |
| PD @ Metal Layer | $M_1$ | $M_1$ | $M_1$ |
| PD @Terminal | G, S, D, NW | G, S, D, NW | G |
| Number of Fuse | 4 | 0 | 0 |
| Number of Fuse Pad | 1 | 0 | 0 |
| Global PD Turn-off Allowed | NO | YES | YES |
| Number of TIL Pad | NA | NA | 4 |
| TIL Pad @ Metal Layer | NA | NA | $M_1$ |
| TIL Pad @Terminal | NA | NA | G, S, D, NW |
| Number of TIL Pad Jumper | 0 | 0 | 0 |
| TIL Pad Jumper @ Metal Layer | NA | NA | NA |
| Inline Pad Allowed | NO | At any one or any more metal layers below bond pad layer, up to total N-1 layers | At any one or any more metal layers above $M_1$ and below bond pad layer, up to total N-2 layers |

METHOD AND APPARATUS FOR BOND-PAD CHARGING PROTECTION OF TRANSISTOR TEST STRUCTURES

CROSS-REFERENCE TO RELATED APPLICATION

This application claims the benefit of U.S. Provisional Application No. 62/179,234, filed on May 4, 2015.

BACKGROUND

1. Technical Field

The present disclosure represents a method and apparatus that enable the robust bond-pad charging protection for transistor test structures including reference and non-reference ones for charging- and non-charging-monitoring applications.

2. Description of Related Art

Transistor test structures are indispensable in monitoring the health of transistors during the integrated-circuit (IC) process technology development. However, the size of bond pads required in these test transistors for the measurement purpose is usually quite large, easily introducing strong process-related charging effect to degrade the transistor characteristics during the back-end (BE) IC manufacturing process. The process-related charging effect could lead to the characteristics of transistor test structures being quite different from those of the transistors in circuits. This is particularly true for thick gate-oxide test transistors operating at medium to high chip operation supply voltages in the I/O portion of the circuits. These transistors have gate oxide thickness typically ranging from 40 to 150 Å in order to sustain the higher voltages during the operation of the chips. They however are more vulnerable to the charging damage during the plasma-involved BE IC manufacturing process compared to their thin gate-oxide counterparts operating at the low chip operation supply voltages.

Bond-pad charging protection on transistors must be considered during design of transistor test structures to ensure that the transistor characteristics to be monitored may not suffer from bond-pad induced charging signals due to plasma-involved process charging effect.

The considerations for the bond-pad charging protection on charging- and non-charging-monitoring transistor test structures are different. The conventional method generally provides the protection at the transistor gate terminal though such method has been proved inadequate in certain applications.

SUMMARY

The present disclosure presents a method and an apparatus for the test-structure bond-pad charging protection. The present disclosure aims at achieving a robust bond-pad charging protection for the transistor test structures including reference and non-reference ones for charging- and non-charging-monitoring applications.

For the charging-monitoring application, the present disclosure includes simultaneously protecting all the transistor terminals with MOSFET-based gated diode(s) or back-to-back N-P and P-N junction diode pair(s) at an uppermost metal layer where the bond pads exist.

For the non-charging-monitoring application, the present disclosure may include, with MOSFET-based gated diode(s) or back-to-back N-P and P-N junction diode pair(s), either (i) simultaneously protecting all the transistor terminals at a lowest metal layer (denoted as $M_1$), or (ii) protecting the transistor gate terminal at $M_1$ layer and placing an $M_1$ plate of a full bond-pad size at all the transistor terminals, which help reduce the charging effect induced from both the top-metal-layer bond pads and the unintended antenna inherited in the transistor test structures.

The above protection methods may facilitate the inline transistor health monitoring by allowing the probing pads to be present at all the metal layers below the top-metal-layer bond pads and at all the transistor terminals, while applying the global turn-off method, which has been disclosed by the inventor of this application, Wallace Lin, on a U.S. Pat. No. 7,974,055 titled "Method for Protecting Circuits from Damage Due to Currents and Voltages During Manufacture," for the protection device(s) (PD) or the method of shunting away the PD leakages, which has been disclosed by the inventor of this application, Wallace Lin, on a paper titled "A new technique for measuring gate-oxide leakage in charging protected MOSFETs," published in Journal of IEEE Trans. Electron Devices, vol. 54, no. 4, pp. 683-691, April 2007.

For further understanding of the present disclosure, reference is made to the following detailed description illustrating the embodiments and examples of the present disclosure. The description is only for illustrating the present disclosure, not for limiting the scope of the claim.

BRIEF DESCRIPTION OF THE DRAWINGS

The drawings included herein provide further understanding of the present disclosure. A brief introduction of the drawings is as follows:

FIG. 1(c) is a cross-sectional view of the bond pad region of the root non-reference transistor test structure for charging-monitoring application according to one embodiment of the present disclosure;

FIG. 2 is a matrix of transistor test structures designed with different TBP and LPP locations to examine the effectiveness of bond-pad charging protection according to one embodiment of the present disclosure;

FIG. 6 is the simulation result of simultaneous protection of all transistor terminals by PD(s) with TBPs' at $M_6$ layer in both positive and negative charging events according to one embodiment of the present disclosure;

FIG. 10(a) is a table summarizing the elements required for building the charging-monitoring non-reference transistor test structures with bond pad charging protection according to one embodiment of the present disclosure; and FIG. 10(b) is a table summarizing the elements required for building the non-charging-monitoring non-reference transistor test structures with bond pad charging protection according to one embodiment of the present disclosure.

DESCRIPTION OF THE EXEMPLARY EMBODIMENTS

Figure 1A:
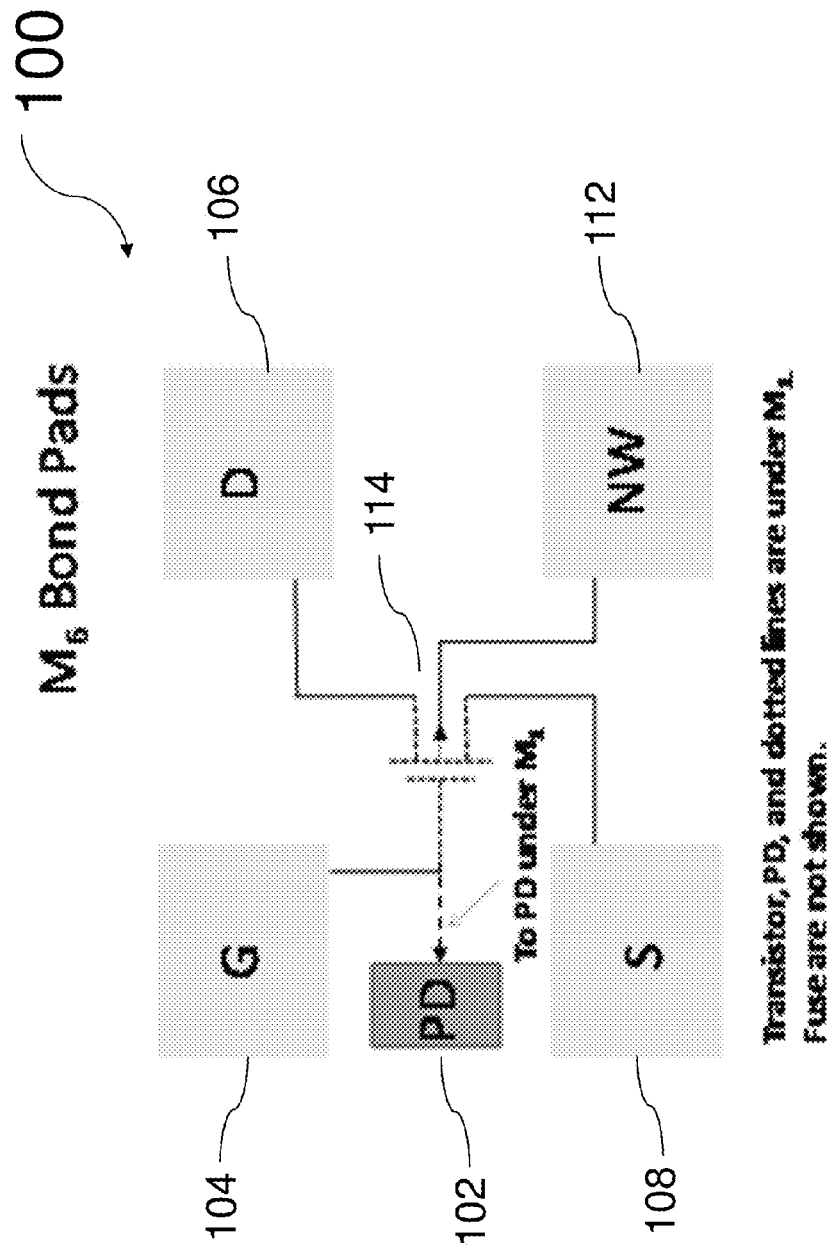
FIG. 1(a) is a top view of the $M_6$ bond pad design for the root reference and root non-reference transistor test structures according to one embodiment of the present disclosure.

The aforementioned and other technical contents, features, and efficacies will be shown in the following detailed descriptions of a preferred embodiment corresponding with the reference figures.

The present disclosure provides a general and robust bond-pad charging protection method for the transistor test structures including the reference and non-reference ones for charging- and non-charging-monitoring applications. The simulation experiments guided analysis and derivation suggests the different bond-pad protection methods for the different applications in the different test structures.

The process technology used in the simulation experiments has a 6-metal-layer Copper Damascene interconnect patterning process. The gate oxide thickness of the P MOSFET test structures is 60 Å. 5000 Å could the thickness of all ILD (inter-level dielectric) layers in the simulations. For the plasma loading characteristics used in the simulations, the open-circuit voltage ($V_{OC}$) and the short-circuit current density ($J_{SC}$) are 10 V and $7.5 \times 10^{-6}$ Amp/cm², respectively. Each of the four terminals of the test-structure transistor is connected with a full-size bond pad of 100 μm by 100 μm at the top metal layer ($M_6$) in one embodiment.

The simulation experiments will utilize the knowledge we discovered that placing a large-area lower-layer metal plate (or equivalently, a lower-layer metal structure of any shape with a large area; and this technique can further be applicable to a structure that is even lower than the position of metals such as a poly structure of any shape with a large area) at the gate terminal of a charging-antenna transistor structure can reduce the charging effect due to reduction of the ILD impedance between the transistor gate and the substrate. Such technique may be utilized to reduce other transistor terminal-to-substrate impedances if a large-area metal or poly plate is placed to a particular transistor terminal which is not the gate terminal. Thus, the technique can serve as a method for protecting the plasma charging at all transistor terminals.

When the transistor source-to-substrate (S-to-Sub), drain-to-substrate (D-to-Sub) and NW-to-substrate (NW-to-Sub) impedance is properly controlled, the large charging damage caused by the reverse-mode charging effect which occurs when a protection device is connected at the transistor gate may be controlled as well.

The simulation experiments begin with the non-charging-monitoring transistor test structures first, followed by the charging-monitoring ones. General protection methods that protect both the reference and non-reference transistor test structures will be sought for both the charging- and non-charging-monitoring applications. In order to systematically identify the desirable protection methods, two fundamental structures representing the "root" reference and the "root" non-reference transistor test structures are created for the two monitoring applications. These two root test structures have a PD connected at their gates and at $M_1$ layer. Lower-layer metal plate at different metal layers will be inserted into the layout of the root test structures, and simultaneously in the region of the gate (G), source (S), drain (D) and NW bond pads, during the simulation experiments to suit the investigation purpose.

FIG. 1(a) shows the top view of the two root test structures 100. Both the protected transistor and the connection between the top-metal-layer ($M_6$) bond pads and the PD underneath $M_1$ are also shown in drawing with dotted lines. The structure 100 at the top metal layer ($M_6$) shows a MOSFET-based protection device 102, a gate bond pad 104, a drain bond pad 106, a source bond pad 108, a NW bond pad 112, and a test transistor 114. Note that the fuse between the gate terminal and the PD, to be zapped off before the transistor characterization, is not shown in FIG. 1(a). The transistor characterization may include characterizing the test transistor 114 based on their parameters such as the impedance thereof. The fuse pad through which an external bias will be supplied to zap off the fuse is not shown either in FIG. 1(a). The cross-sectional view of the bond pad region of the root reference transistor test structures for the charging-monitoring application is illustrated with the configuration 150 in FIG. 1(b). The bond pad 152 at $M_6$ layer and minimum metals 154 at the metal layers below are shown. Note that this cross-sectional illustration 150 applies to all transistor terminals—G, S, D and NW. For the illustration purpose, the dimension (such as width and thickness) of the $M_6$ bond pad and the metals below, the vias, and the Inter-(Metal) Layer Dielectrics (ILDs) are not scaled with real dimension.

For the non-charging-monitoring application, the transistor test structures here are designed for various purposes. One specific example is to monitor the transistor characteristics including but not limited to the threshold voltage, on-state current, and off-state current and their relationship with the transistor channel width or length. The root reference transistor structure has a gate drawn width/length (W/L) of 10/0.4 μm in one embodiment. The root non-reference transistor structure has a narrow channel width with a drawn gate W/L=1/0.4 μm in one example. The cross-sectional view in the bond pad region for both the root reference and non-reference test structures for the non-charging monitoring application may be the same and shown in FIG. 1(b).

For the charging monitoring application, the transistor test structures may be designed to monitor the transistor charging performance versus the antenna ratio or the amount of the metal connected to the transistor terminals. The root reference transistor structure here is the same as the root non-charging-monitoring reference transistor shown in FIGS. 1(a) and 1(b). The root non-reference transistor structure in one implementation may be designed by adding a $M_5$ plate 156 of 100 μm by 100 μm (i.e., as large as the full bond pad) to the root reference transistor structure. The inserted metal plate serves as the metal antenna. FIG. 1(c) illustrates the layout cross-sectional view in the G, S, D and NW bond-pad regions for this root non-reference transistor test structure.

A matrix of the transistor test structures is designed to examine the extent of the large-area lower-layer metal plates can withstand the bond-pad patterning process-induced charging effect. This matrix, shown in FIG. 2, may be shared by both the charging- and non-charging-monitoring transistor test structures in the simulation experiments. The large-area lower-layer metal plate is inserted into the root transistor test structures 100 and 150. For simplicity, the inserted lower-layer metal plates and the full bond pad may be same in size. Consequently, the inserted large metal plate is referred to as LPP or Lower-layer Probing Pad in the design matrix since they can be used for the probing purpose. On the other hand, TBP stands for Top-layer Bond Pad in the matrix. The matrix indicates the location of the TBP and LPP. In the design matrix, the higher the TBP of the test structures is, the more the LPPs are required. For example, a test structure of $M_6$ TBP can have 5 LPP located from $M_1$ to $M_5$. Whereas, a test structure of $M_2$ TBP can only have one LPP at $M_1$. Simulations based on the design matrix in FIG. 2 are performed and the results are presented in the following paragraphs.

Non-Charging-Monitoring Transistor Test Structures

The simulations are performed for both negative and positive charging events. Since the two events produce similar results with opposite signs on simulated terminal voltages and inter-terminal voltage drops, only the results from negative-charging-event simulations will be presented here for the illustration purpose.

Since the simulated terminal voltages and inter-terminal voltage drops related to the transistor source and drain terminals may be quite similar or even symmetrical, data in the following will be presented solely in terms of $V_G$, $V_S$ and $V_{GS}$. Note that these simulated terminal voltages and inter-terminal voltage drops are the worst-case (i.e., maximum) voltages and voltage drops occurring at the beginning of the ILD or pad-nitride deposition or at the end of ILD or pad-nitride etch-back process. In other words, the strongest charging effect may take place when these plasma-involved deposition starts or the etch-back process concludes.

Figure 1B:
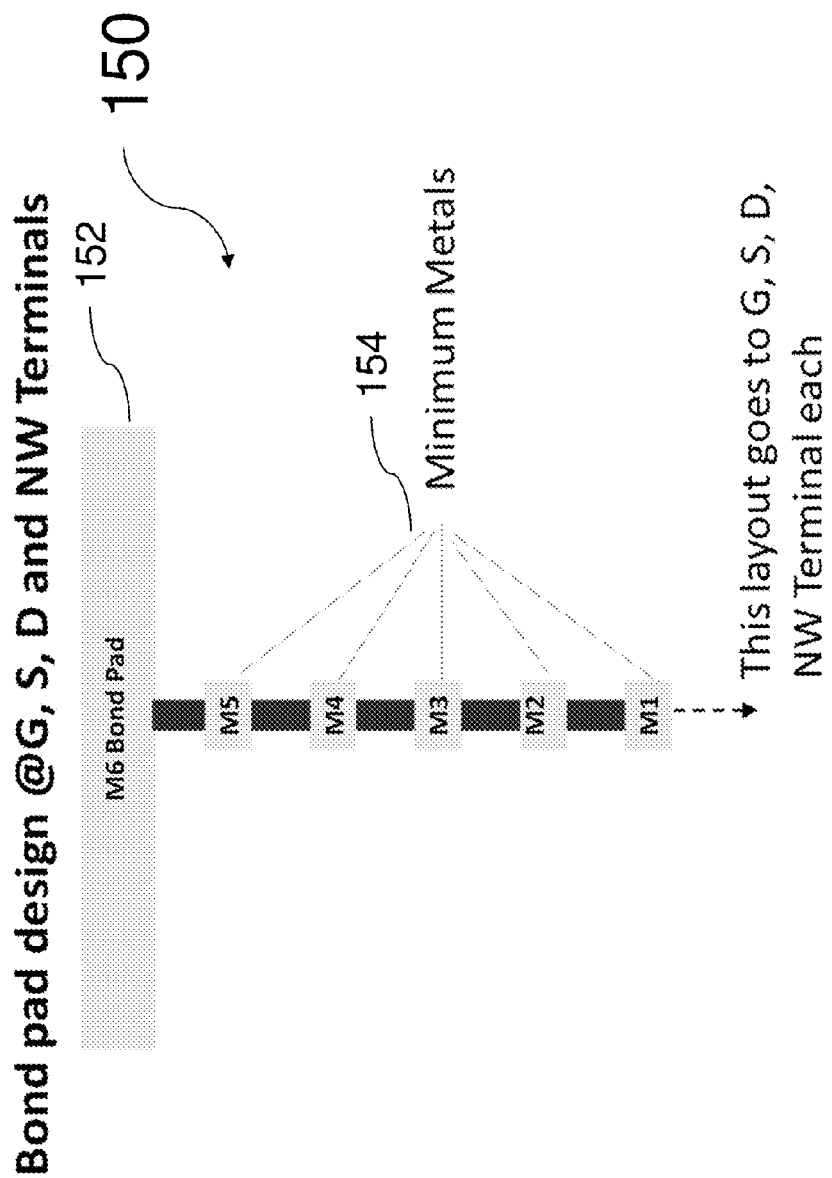
FIG. 1(b) is a cross-sectional view of the bond pad region of the root reference transistor test structure for both charging- and non-charging-monitoring applications according to one embodiment of the present disclosure.
Figure 3A:
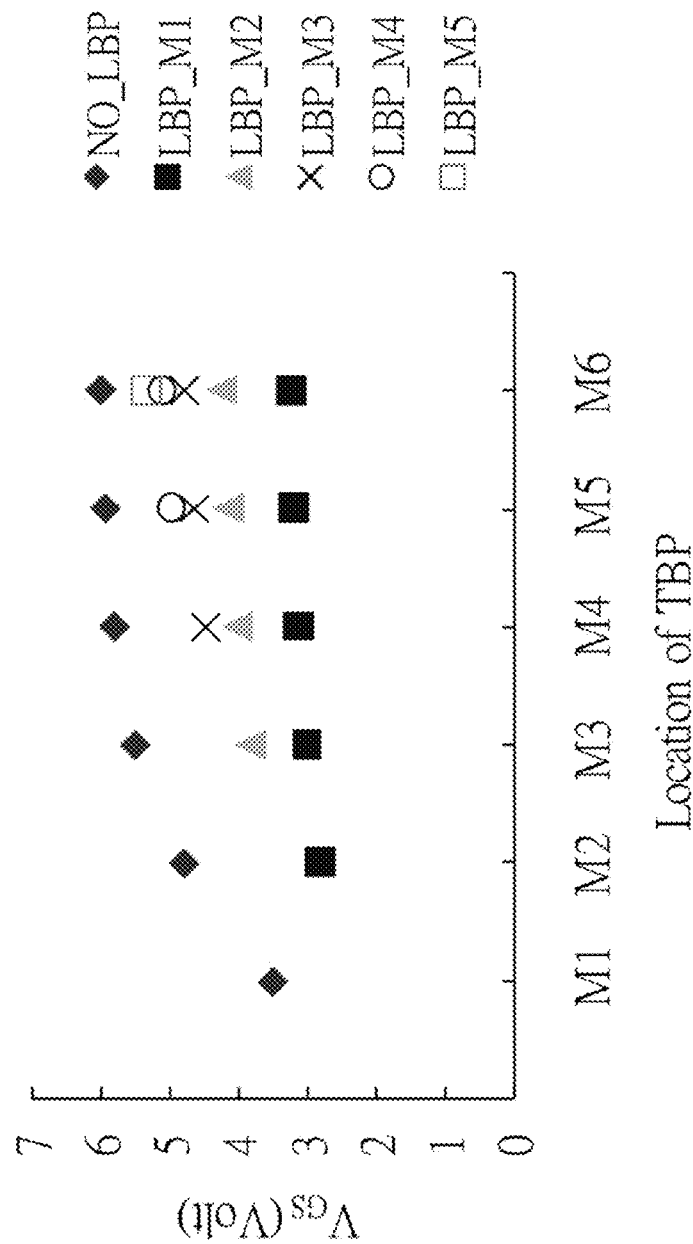
FIG. 3(a) is the data of the simulated worst-case $V_{GS}$ versus location of top-metal-layer bond pads at transistor terminals with and without metal plates of full bond pad size placed at lower metal layers according to one embodiment of the present disclosure.

FIG. 3(a) shows the simulated $V_{GS}$ versus the LPP location with and without any LPP placed at the lower metal layers based on the design matrix in FIG. 2 and the root reference transistor test structures 100 and 150 in FIGS. 1(a) and 1(b). The result indicates that when no LPP is placed at the lower metal layer (i.e., No_LPP case) $V_{GS}$ for any given TBP location may become the highest. As the LPP location lowers, $V_{GS}$ may lower accordingly. When the LPP is placed at $M_1$, $V_{GS}$ may be reduced to its lowest value. With the LPP at $M_1$, $V_{GS}$ may range from 2.8V (TBP at $M_1$) to 3.2V (TBP at $M_6$). This is in a sharp contrast with the No_LPP case where $V_{GS}$ ranges from 3.5V (TBP at $M_1$) to 6V (TBP at $M_6$).

Figure 3B:
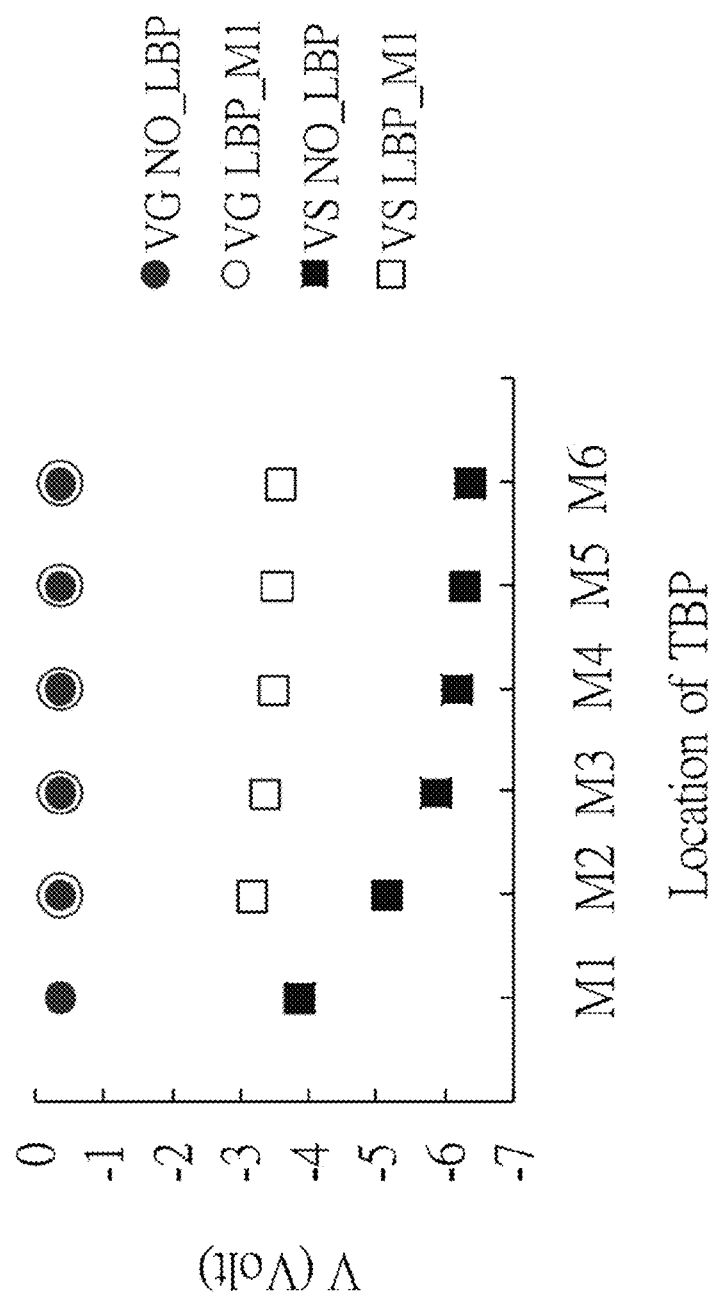
FIG. 3(b) is the data of the simulated worst-case $V_G$ and $V_S$ versus location of top-metal-layer bond pads at transistor terminals with and without metal plates of full bond pad size placed at lower metal layers according to one embodiment of the present disclosure.

FIG. 3(b) shows the break-down details of the simulated $V_{GS}$ in for no LPP and with LPP at $M_1$ cases. Due to a PD at the transistor gate terminal, $V_G$ in the two cases stays low and nearly the same at about −0.37V. In contrast, $V_S$ may vary from one case to the other. Specifically, $V_S$ ranges from −3.2V (TBP at $M_2$) to −3.6V (TBP at $M_6$) in the case of LPP at $M_1$ while it spans from −3.9V (TBP at $M_1$) to −6.4V (TBP at $M_6$) in the case of no LBP.

Figure 3C:
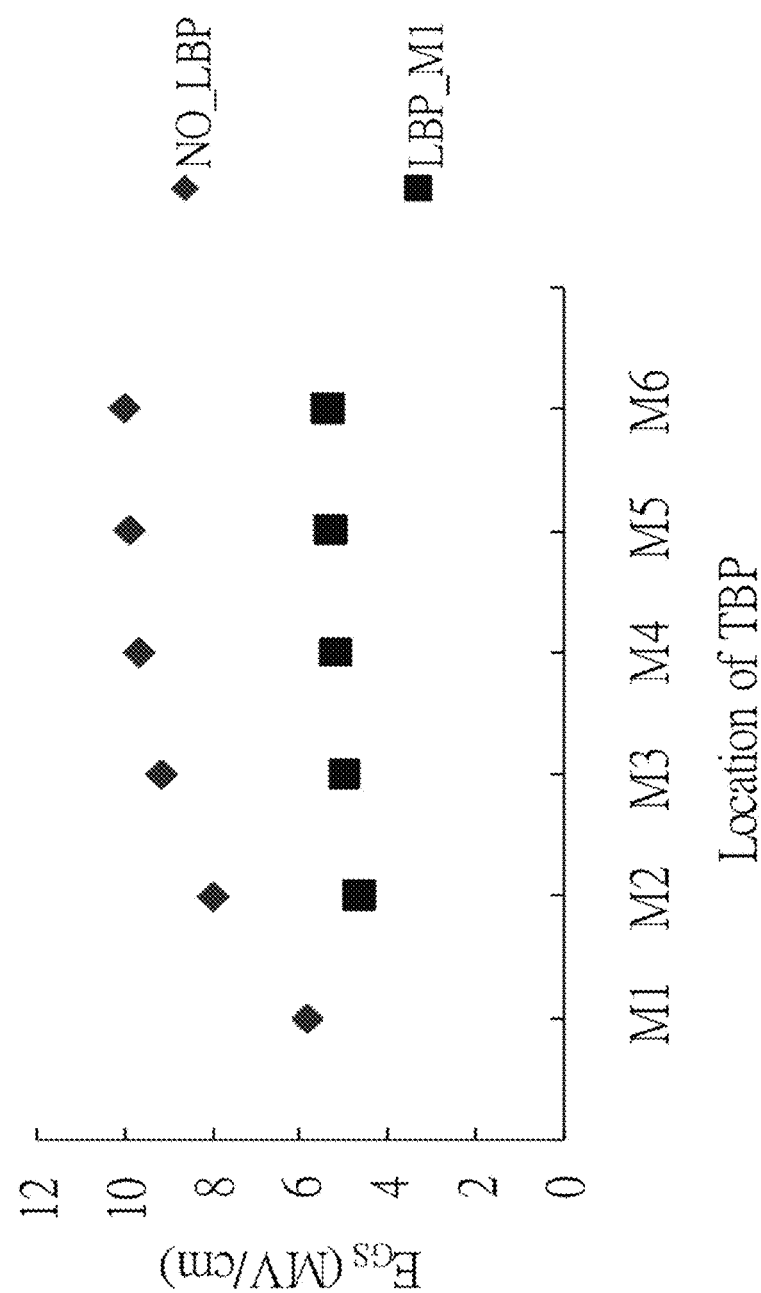
FIG. 3(c) is the data of the simulated worst-case $E_{GS}$ versus location of top-metal-layer bond pads in the case of no lower-layer metal plates and with $M_1$ plates of full bond pad size according to one embodiment of the present disclosure.

FIG. 3(c) is a translation of $V_{GS}$ of the No_LPP and LPP_$M_1$ case in FIG. 3(a) into $E_{GS}$, which stands for the electric field (E-field) in the oxide of the gate-to-source overlap region. $E_{GS}$ in LBP_$M_1$ case has E-field less than 5.4 MV/cm for all TBP locations, which is substantially lower than the degradation-threshold E-field for the gate oxide breakdown, which could be 10 MV/cm. This result here clearly confirms that the bond-pad charging protection method by placing the low-layer metal plates at the transistor terminals indeed satisfies the need.

Figure 4:
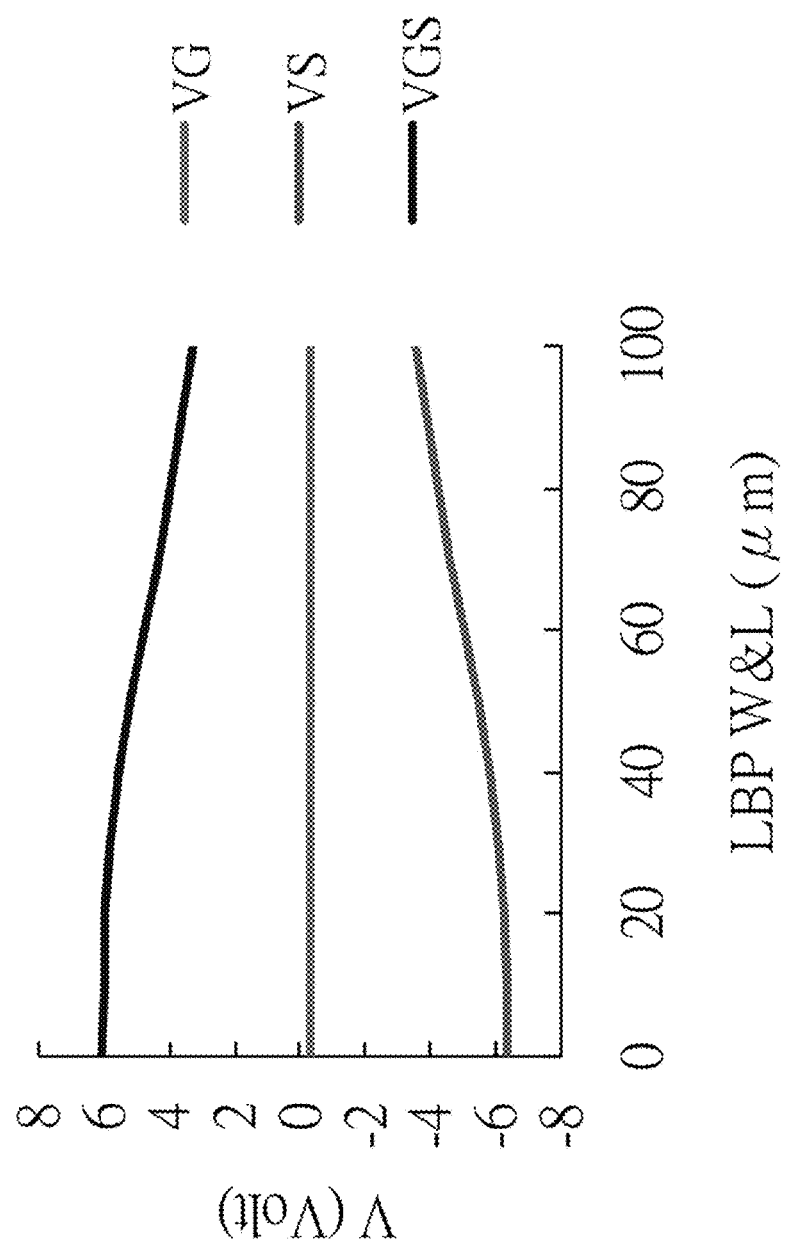
FIG. 4 is the data of the simulated worst-case $V_{GS}$ and $V_G$ and $V_S$ versus width and length of the $M_1$ plates placed at transistor terminals (The metal plates have equal width and length) according to one embodiment of the present disclosure.

Despite the $M_1$ LPP may provide the strongest charging protection, the protection efficiency of the size of the $M_1$ LPP is also investigated with the result shown in FIG. 4. The width and length of the $M_1$ LPPs placed at the transistor G, S, D and NW terminals may vary from 0×0 μm to 100×100 μm in simulations. The $M_1$ LPP of 100×100 μm may result in the lowest $V_{GS}$, which may stand for the best protection. FIGS. 3 and 4 may indicate that placing a $M_1$-layer metal plate of full bond-pad size could serve the protection purpose on the induced charging associated with the top-metal-layer bond-pad patterning process, for the non-charging-monitoring reference transistor test structures.

Figure 5:
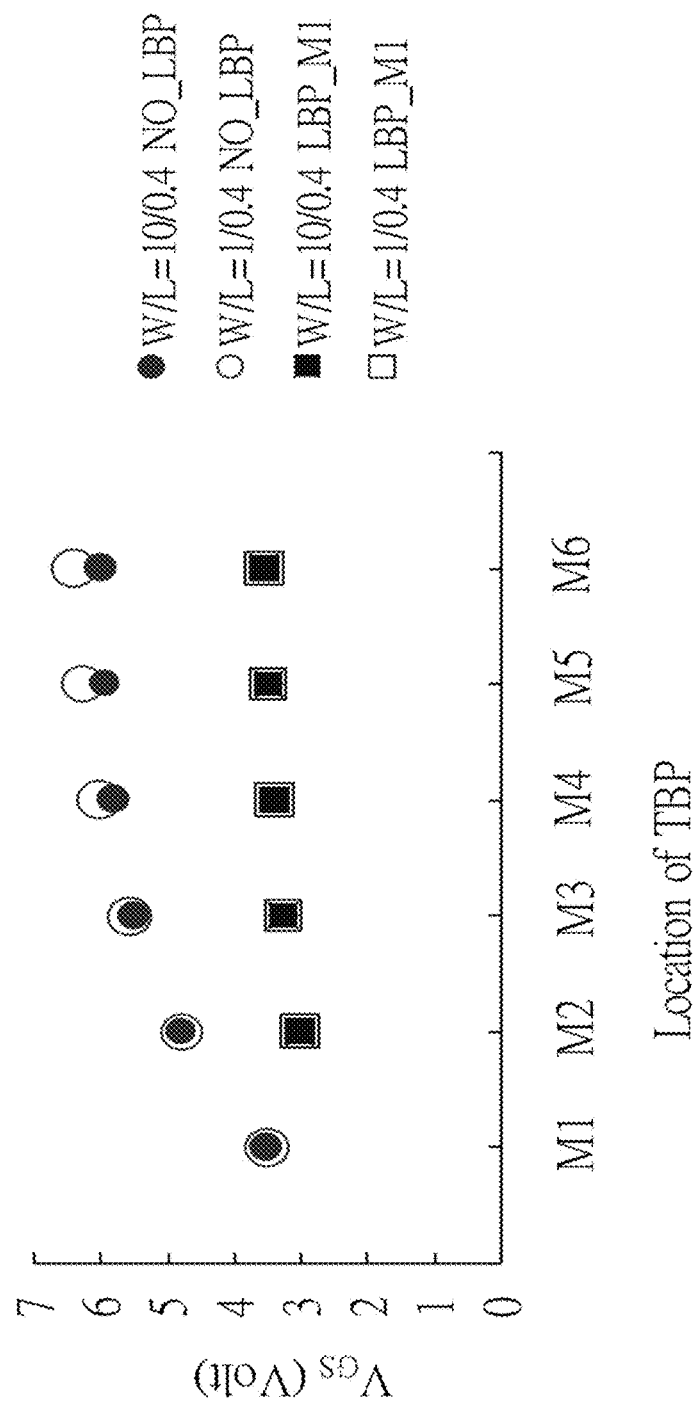
FIG. 5 is the comparison of simulated worst-case $V_{GS}$ versus location of top-metal-layer bond pads at transistor terminals between the non-charging-monitoring reference (W/L=10/0.4 μm) and non-reference (W/L=1/0.4 μm) transistor test structures in the case of no LPP and with $M_1$ LPP according to one embodiment of the present disclosure.

For the non-charging-monitoring non-reference transistor test structure, the narrow drawn channel width of 1 μm reduces the transistor gate area and hence increases the antenna ratio at the transistor gate terminal. (Gate antenna ratio is defined as the ratio between the area of the metal connected at the transistor gate terminal and the area of the transistor gate.) As a result, the transistor may experience the stronger charging effect. FIG. 5 shows the comparison between this non-reference transistor test structure and the reference transistor test structure on $V_{GS}$ versus TBP location in No_LPP and LPP_$M_1$ cases, respectively. $V_{GS}$ in the No_LPP case increases some at the high TBP locations in the non-reference transistor test structure. However, in the LPP_$M_1$ case, both reference and non-reference transistor test structures may have identical $V_{GS}$. This result may suggest that placing the $M_1$ LPPs at the transistor terminals provides the robust protection for the non-charging-monitoring non-reference transistor test structure.

Charging-Monitoring Transistor Test Structures

The charging-monitoring reference transistor test structure may be identical to the non-charging-monitoring one. Consequently, the robust protection on non-charging-monitoring reference transistor test structure by placing the large-area lower-layer metal plates at the transistor terminals may be present in the charging-monitoring reference transistor test structure.

For the charging-monitoring non-reference transistor test structures, let us now look at the root test structure proposed in FIG. 1(c) which has a $M_5$ antenna 156 of the full bond pad size at all transistor terminals. With the $M_5$ layer antenna here in a 6-metal-layer technology, the $ILD_5$ process would be associated with the charging-related impact. Such impact can be estimated from the case of $M_5$ TBP with No_LPP in FIG. 3(a) where $V_{GS}$ is close to 5.9V. However, the charging source for the $M_5$ TBP case here is from the pad-etch process which normally produces the stronger charging effect than the $ILD_5$ process. Thus, one could expect that $V_{GS}$ would be smaller than 5.9V. If an $M_1$ LPP of the full bond pad size is inserted into this root non-reference transistor test structure, one would expect that the $V_{GS}$ would be less than 3.19V, in the case of the $M_5$ TBP with the $M_1$ LPP in FIG. 2(a) when the $ILD_5$ process is performed.

When the process moves to the patterning of the $M_6$ bond pads, the situation may be considered as $M_6$ TBP being processed with two LPPs underneath, LPP at $M_1$ and LPP at $M_5$, at all the transistor terminals. This would raise $V_{GS}$ to be less than 3.24V, which is the case with $M_6$ TBP and LPP_$M_1$ in FIG. 3(a), because the additional lower LPP at $M_5$ would further reduce the ILD impedances between the transistor terminals and the substrate. The above analysis would conclude that placing the $M_1$ LPPs into the charging-monitoring non-reference transistor test structure here would effectively shield off the charging effect in the test structure.

The shielding of the charging effect in the test structure may not be what one would like to see especially when it comes to monitoring the charging effect in the charging-monitoring non-reference transistor test structure. Thus, the above method is inadequate for the non-reference transistor test structure.

The fundamental difference in the purpose of the bond-pad charging protection between the charging- and non-charging-monitoring applications is that for the charging-monitoring application, the non-reference transistor test structures are designed such that only the charging effect on the particularly-designed metal antenna in these test structures is retained and monitored. On the other hand, the charging-monitoring reference transistor test structures are designed to completely rid off any charging effect or contamination. As a result, placing the large-area $M_1$ pads at the transistor terminals may be only appropriate for the non-reference transistor test structures in the charging-monitoring application.

Since the data of NO_LPP case in FIG. 3(a) indicates that the non-reference transistor test structures for the charging-monitoring application would suffer from the gate oxide damage particularly when TBPs are located in higher metal layers, FIG. 6 may provide one viable solution to the above situation. FIG. 6 actually shows the simulation result of having all the transistor terminals simultaneously protected with the TBPs' at $M_6$ layer in both the positive and negative charging events. All inter-terminal potential drops are zero. The results are the same for TBPs' located at all higher or lower metal layers. In fact, the above approach is similar to the charging-free bond-pad charging protection on the reference transistor test structures for both the charging- and non-charging-monitoring applications. The only difference here is that for the purpose of protecting the charging-monitoring non-reference test structures, the connecting point(s) of the PD(s) to the metal layer is (are) moved from the $M_1$ to the top-metal layer. This is because in such condition the charging effect induced by the particularly-designed metal antenna is located below the top-metal layer, leaving the top-metal layer unprotected. The PD(s) only protect(s) the charging effect induced from the top-metal-layer bond pads. Placing the PD(s) at top-metal layer would only be allowed for the charging-monitoring reference transistor test structure when minimum metals may be required at the metal layers below the top-metal-layer bond pads in the reference transistor test structures.

Figure 7A:
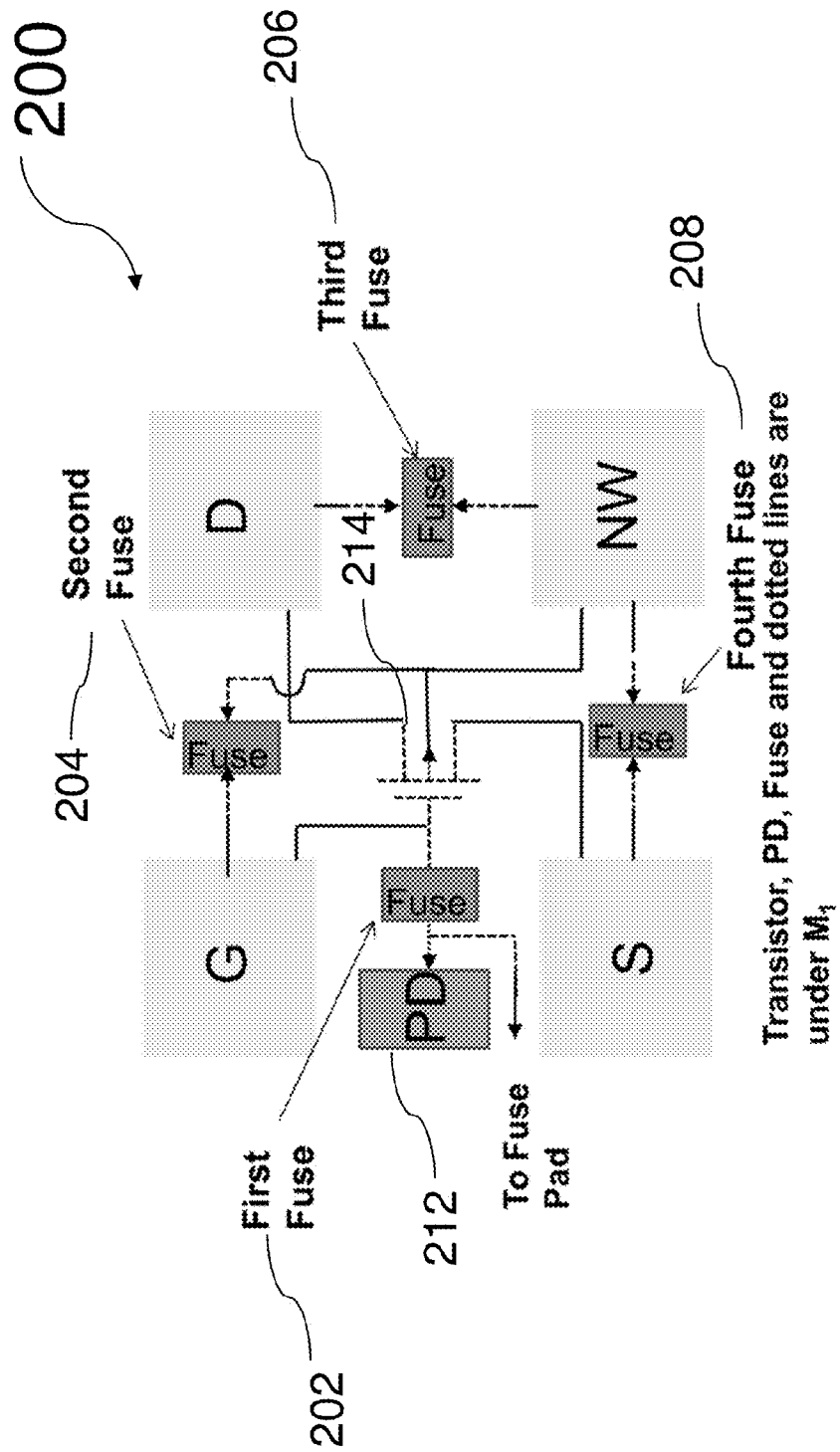
FIG. 7(a) is a top view of a simplified design in which only one PD is used to simultaneously protect the charging-monitoring non-reference transistor test structures according to one embodiment of the present disclosure.

The multiple PDs that simultaneously protect the charging-monitoring non-reference transistor test structures can be replaced by one single PD with the top-metal-layer bond-pad design described in FIG. 7(a) which also considers the minimum usage in layout space as well as the minimum gate oxide stress during the fuse zap-off process.

FIG. 7(a) shows the top view of such simplified design 200 in which only one PD 212 is used, and such PD 212 is connected at the gate terminal of the PMOS transistor 214 through a first fuse 202. Four fuses, each connected to one transistor terminal, are still required in such configuration. However, only one fuse pad which is located between the protection device 212 and the fuse 202 directly connected to the transistor gate terminal is required. The remaining three fuses including the second fuse 204, the third fuse 206 and the fourth fuse 208 may indirectly (e.g., through the fuse pad) connect to the gate, drain and source terminals respectively, and the other ends of them may all connect to the NW pad or terminal. Such configuration enables using the existing 4 bond pads in the zap-off process of the above three fuses, 204, 206 and 208, without introducing extra fuse pad(s). For example, to zap off the fuses between the gate and NW terminals, drain and NW terminals and source and NW terminals, one can simultaneously apply a negative bias such as −4V to the gate, drain and source pads and a ground bias to the NW pad. The same bias at the gate, drain and source pads ensures no stress on the gate oxide in the transistor G-to-S and G-to-D overlap regions during the fuse zap-off process. The −4V at the gate pad and the ground bias at the NW pad collectively drives the transistor into the depletion condition (i.e., $V_{GS}=0V$). This substantially reduces the voltage across the gate oxide in the G-to-C overlap region and therefore minimizes the gate oxide stress due to the existence of a depletion region underneath the gate channel which takes away a large portion of the voltage drop between the gate and NW pads. The design here with one protection device and one fuse pad also ensures a minimum usage of the layout space.

Therefore, a general bond-pad charging protection method for the charging-monitoring transistor test structures in view of the above may be summarized as follows:
(i) Connecting a 2-way PD 212 to all terminals of the transistor test structure 214 at the top metal layer 256 shown in cross-sectional layout configuration 250 in FIG. 7(*b*) where the metal antenna layer 252 is also shown;
(ii) Designing the top-metal-layer bond pads with the arrangement for bond pads, fuses and PD described in the configuration 200 of FIG. 7(*a*).

Note that a 2-way PD 212 serves to protect in both positive and negative charging events. The PD may be a MOSFET-based gated diode. It may also be a P-N diode connected in parallel with an N-P diode. The above method may be referred to as Method 1.

Figure 7B:
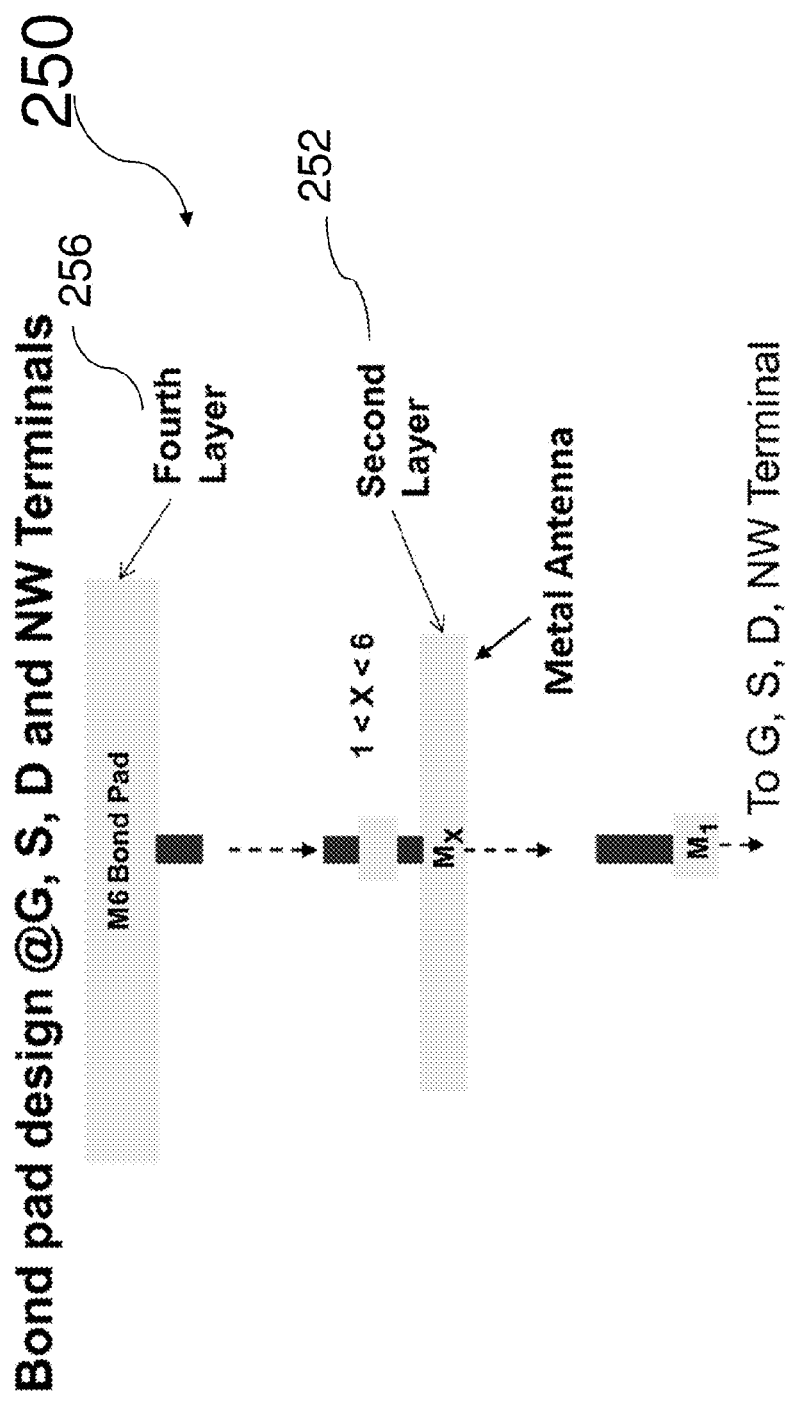
FIG. 7(b) is a cross-sectional view of the bond-pad region in a simplified design using only one PD to simultaneously protect the charging-monitoring non-reference transistor test structures and the insertion of probing pads at lower metal layers is not allowed according to one embodiment of the present disclosure.
Figure 7C:
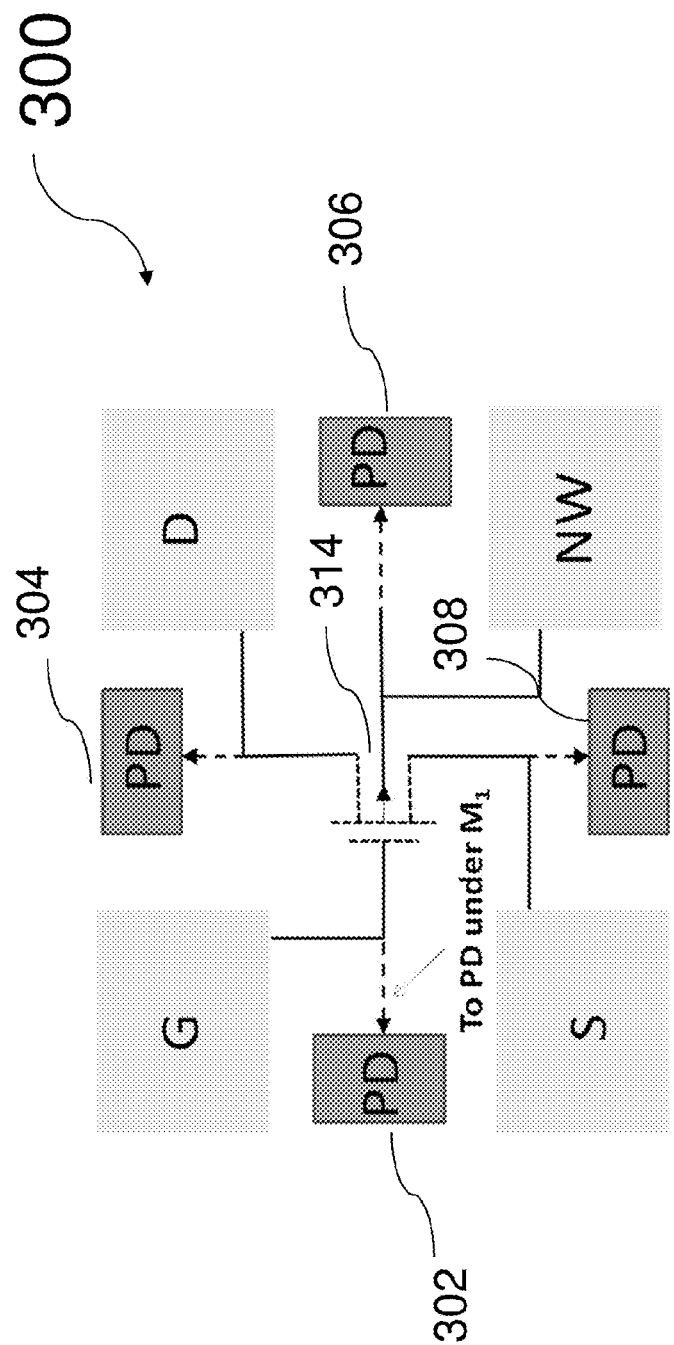
FIG. 7(c) is a top view of the bond-pad design in which multiple PDs are used to simultaneously protect the charging-monitoring non-reference transistor test structures which allows the fuses and associated fuse pads to be eliminated and the global PD-leakage turn-off method deployed according to one embodiment of the present disclosure.
Figure 8A:
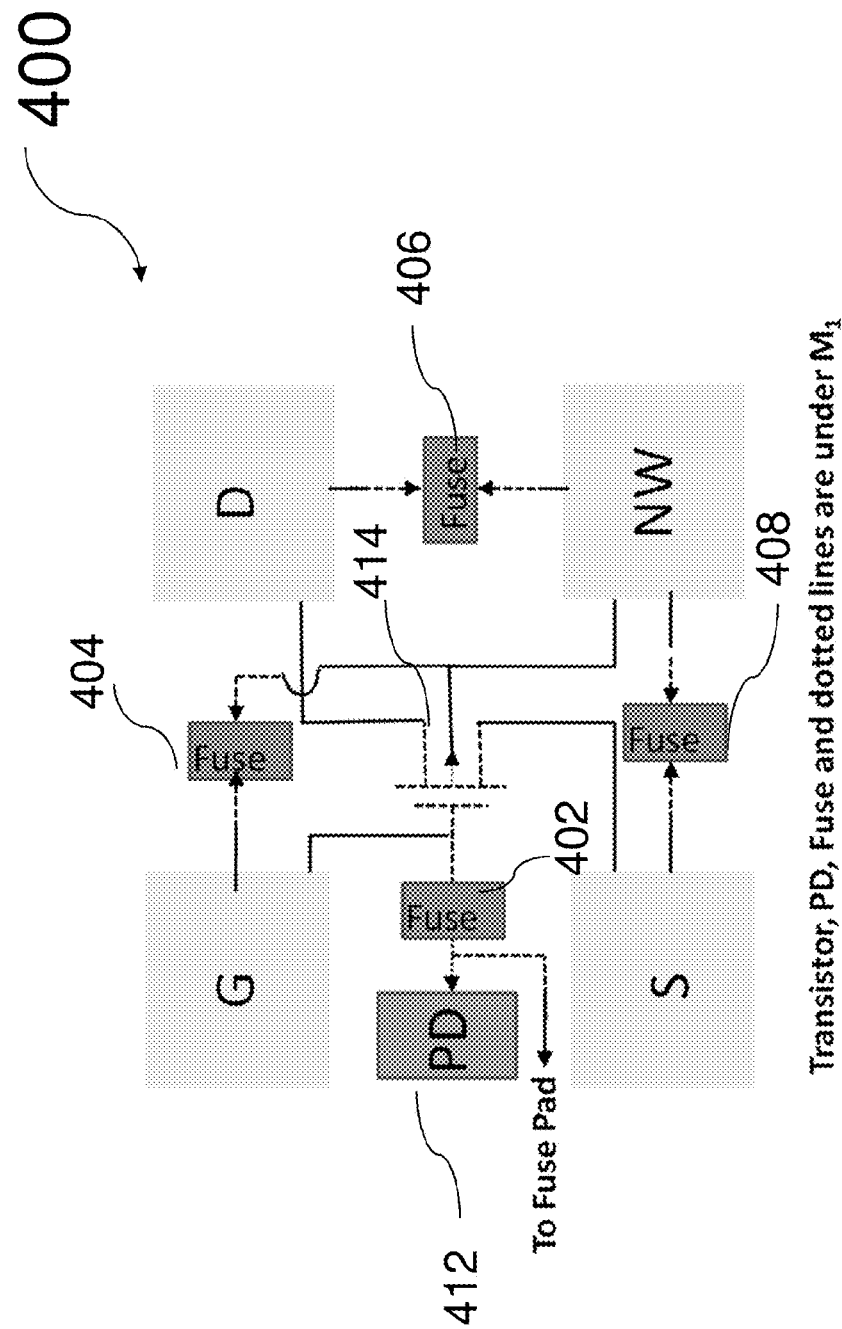
FIG. 8(a) is a top view of a simplified design in which only one PD is used to simultaneously protect the non-charging-monitoring non-reference transistor test structures according to one embodiment of the present disclosure; This design also suits both charging- and non-charging-monitoring reference transistor test structures.
Figure 8B:
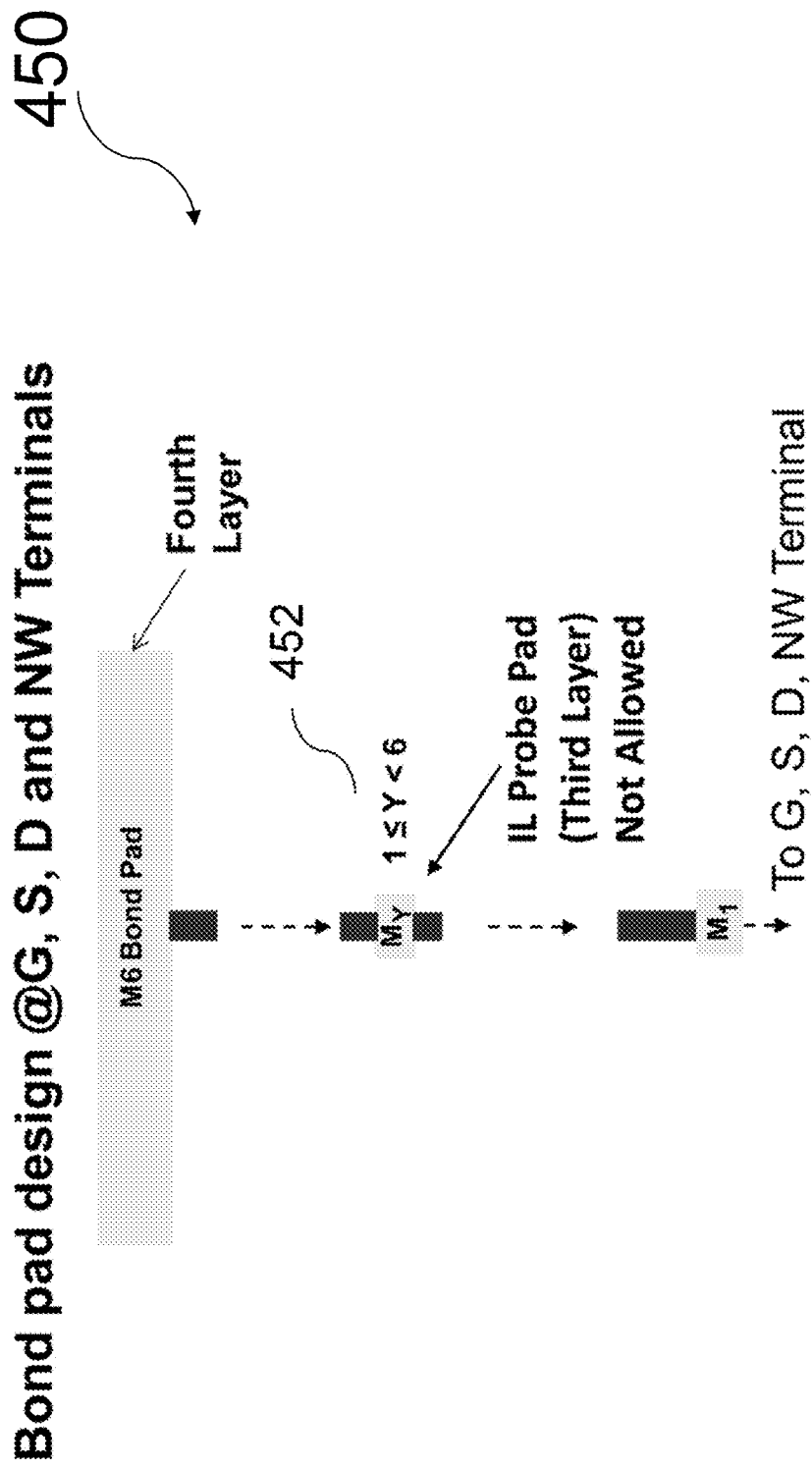
FIG. 8(b) is a cross-sectional view of the bond-pad design in which only one PD is used to simultaneously protect the non-charging-monitoring non-reference transistor test structures and the insertion of probing pads at lower metal layers is allowed according to one embodiment of the present disclosure; This design also suits both charging- and non-charging-monitoring reference transistor test structures.
Figure 8C:
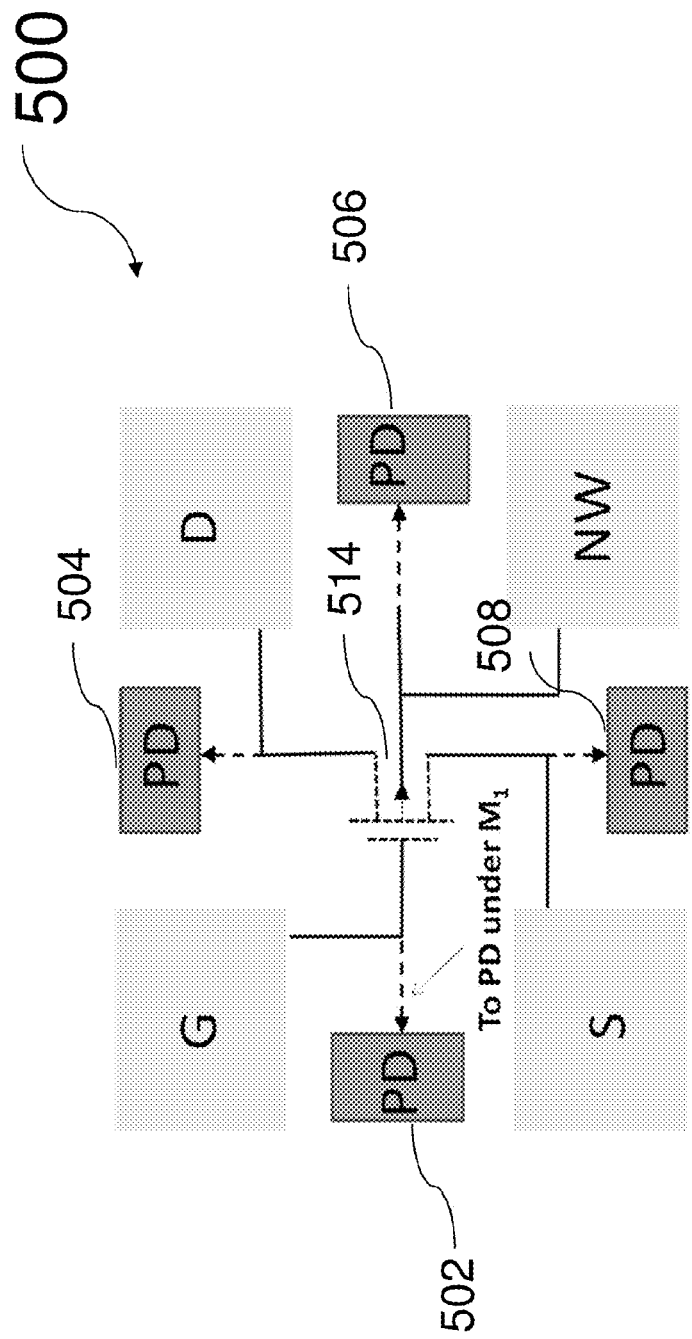
FIG. 8(c) is a top view of the bond-pad design in which multiple PDs are used to simultaneously protect the non-charging-monitoring non-reference transistor test structures which allows the fuses and associated fuse pads to be eliminated, the global PD-leakage turn-off method to be deployed, and insertion of lower-metal-layer probing pads to be allowed according to one embodiment of the present disclosure; This design also suits both charging- and non-charging-monitoring reference transistor test structures.
Figure 8D:
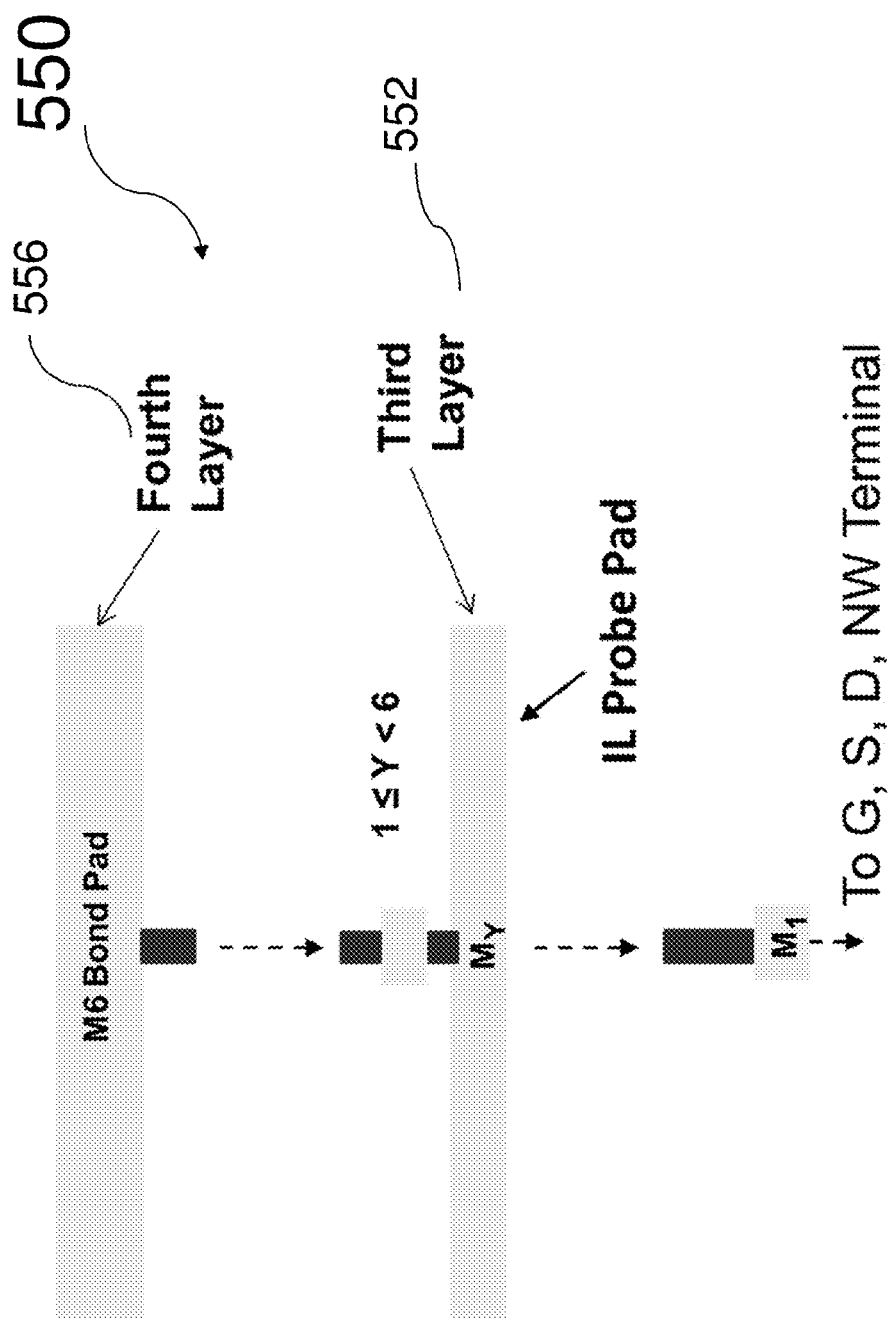
FIG. 8(d) is a cross-sectional view of the bond-pad design in which multiple PDs are used to simultaneously protect the non-charging-monitoring non-reference transistor test structures and the insertion of probing pads at lower metal layers is allowed according to one embodiment of the present disclosure.
Figure 8E:
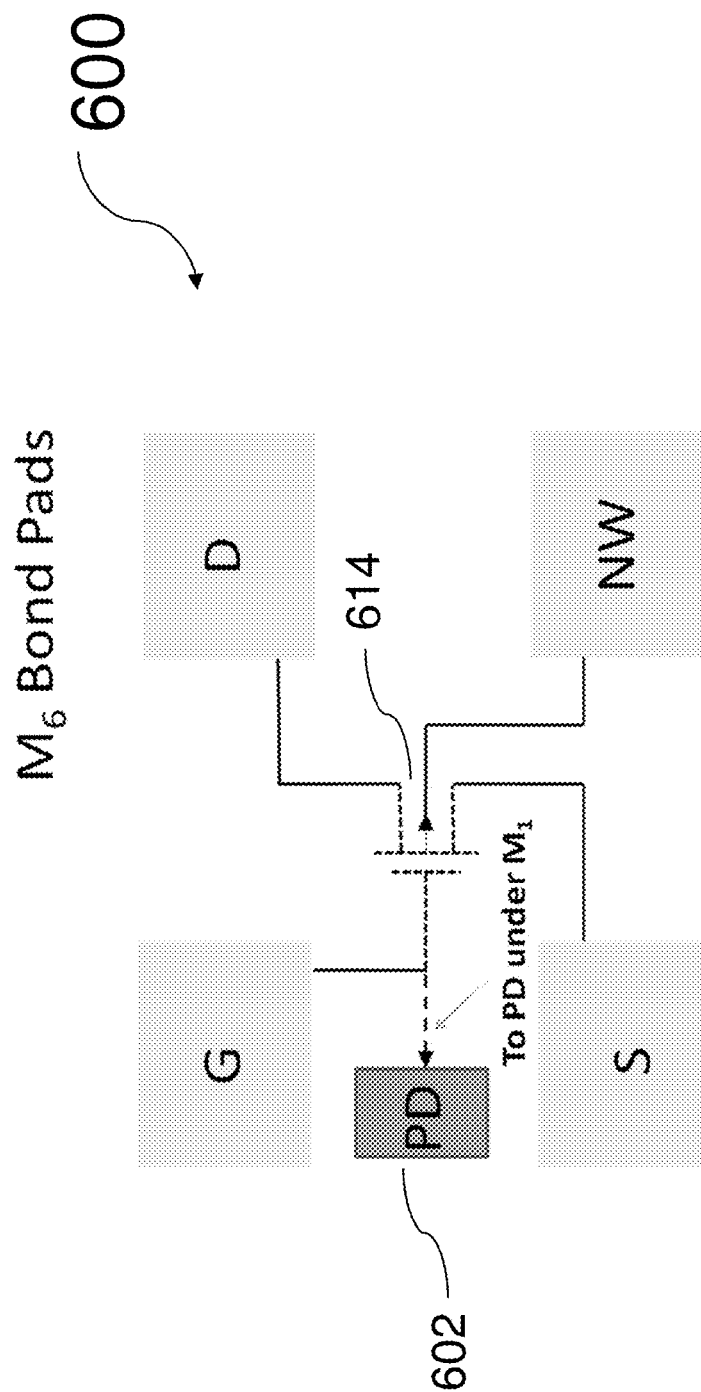
FIG. 8(e) is a top view of the bond-pad design in which one PD protects the gate bond pad of the non-charging-monitoring non-reference transistor test structures and at least one M1 plate of bond-pad size is placed and connected to each of the four terminals of the test transistors which allows the fuses and associated fuse pads to be eliminated and the global PD-leakage turn-off method to be deployed according to one embodiment of the present disclosure; This design also suits both charging- and non-charging-monitoring reference transistor test structures.
Figure 8F:
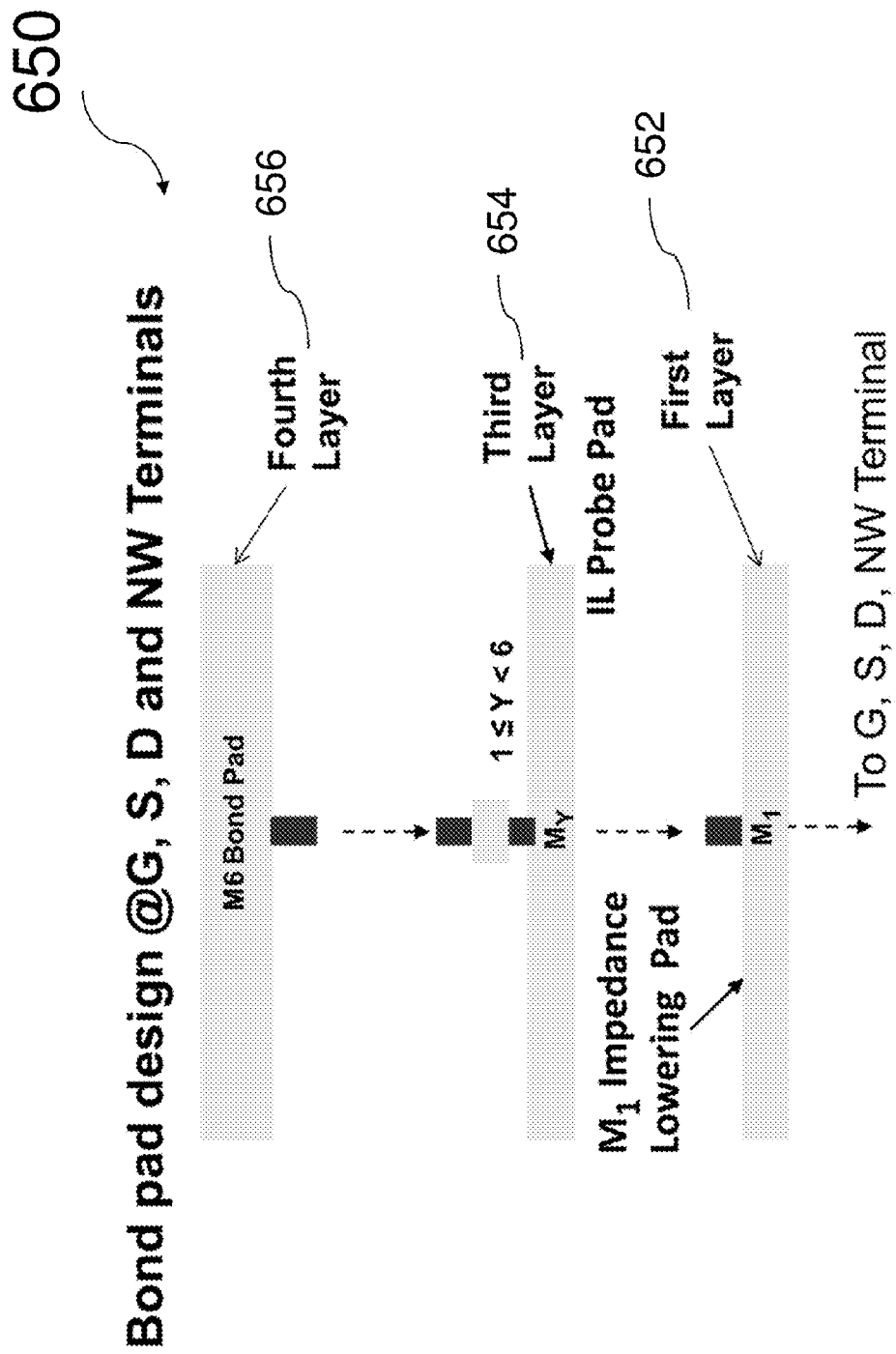
FIG. 8(f) is a cross-sectional view of the bond-pad design in which one PD protects the gate bond pad of the non-charging-monitoring non-reference transistor test structures and at least one M1 plate of bond-pad size is placed and connected to each of the four terminals of the test transistors according to one embodiment of the present disclosure; This design also suits both charging- and non-charging-monitoring reference transistor test structures.

Note that in the case of the multiple PDs, the fuses and associated fuse pads may be eliminated, as in the configuration 300 shown in FIG. 7(*c*) where 4 PDs, 302, 304, 306 and 308, exist, if (i) the global turn-off method for the protections devices or (ii) the method of shunting away the protection device leakages can be implemented. The former may be easier to implement than the latter which requires special layout design considerations. The method indicated in FIG. 7(*c*) may be referred to as Method 2.

The requirement of the bond-pad charging protection method for the non-charging-monitoring application needs also to consider shielding off any charging effect which does not come from the top-metal-layer bond pads in the structures. Therefore, in the non-charging monitoring application, it requires the full charging protection starting from the lowermost metal layer, $M_1$, to the top-metal layer for the transistors.

In the following, for the convenience of introducing the placement of the metal or device at the certain metal layer, we correspond the lowermost metal layer to "a first metal layer," the metal layer where the meta antenna is placed may be referred to as "a second metal layer," the layer where inline probe pad is inserted may be referred to as "a third metal layer" and the uppermost metal layer may be referred to as "a fourth layer." These layers are marked in the cross-sectional view of the transistor test structure layouts in the drawings. It is worth noting that the first metal layer, the second metal layer, the third metal layer, and the fourth metal layer in the specification are named based on the sequence of the manufacturing process (i.e., the first metal layer here is grown ahead of the second metal layer, which is grown before the third metal layer, with the fourth metal layer being prepared in the last as the uppermost metal layer).

Of the two charging protection methods shown in FIGS. 7(*a*) and 7(*c*) for the charging-monitoring non-reference transistor test structures, if one moves the connecting points of the PD(s) from the top-metal layer ("the fourth metal layer") to the $M_1$ layer ("the first metal layer"), a complete protection method can be used to protect the non-charging-monitoring transistor test structures. Thus, there are at least two other alternative methods as follows:
(i) Connecting a 2-way PD 412 to all the terminals of the transistor test structure 414 at the $M_1$ layer, as described in the configuration 400 in FIG. 8(*a*);
(ii) Designing the top-metal-layer bond pads with the arrangement for the bond pads, fuses and PD described in 400 of FIG. 8(*a*).

Or
(i) Connecting a 2-way PD (502, 504, 506 or 508) to each of all the terminals of the transistor test structure 514 at the $M_1$ layer, as described in the configuration 500 in FIG. 8(*c*);
(ii) Designing the top-metal-layer bond pads with the arrangement for the bond pads and PDs and deployment of the global PD turn-off method indicated in 500 of FIG. 8(*c*).

As previously stated, FIG. 3 indicates that placing the large-area $M_1$ plate at the transistor terminals for the bond pad charging protection works quite well for the non-charging-monitoring reference and non-reference transistor test structures. Thus, this method may be summarized as follows:
(i) Connecting a 2-way PD 602 to the gate terminal of the transistor test structure 614 at $M_1$ layer, as described in the configuration 600 in FIG. 8(*e*);
(ii) Placing a $M_1$ terminal impedance-lowering (TIL) plate or pad 652 of full bond-pad size at each of all the terminals of the transistor test structure, as described in the configuration 650 in FIG. 8(*f*);

The method here is illustrated in FIGS. 8(*e*) and 8(*f*) showing a top view of the bond pad configuration and a cross-sectional view of the four pad regions. This method here is referred to as Method 3.

For the non-charging-monitoring application, simultaneously protect all the transistor terminals may be most effective, with nearly "all zero" simulated inter-terminal voltage drops in the transistor test structures resulting in a clean and no-damage protection.

It is noted that for the non-charging-monitoring application, inserting $M_1$ or lower pad of bond pad size in Method 2 or the inserted $M_1$ TIL pad 652 in Method 3 shown in FIG. 8(*f*) at all the transistor terminals could provide one additional benefit—they can serve as the inline probe pads for measurement probing to monitor the transistor health after $M_1$ patterning process, provided that either the global turn-off method for PD or the method of shunting away the PD leakages can be implemented to enable the measurement for the transistor at the end of the patterning process for each of the metal layers. Among the two PD leakage elimination methods proposed here, the latter would be more difficult to implement than the former due to requirement of the special layout consideration In Method 3, at least one M1 plate of the bond pad size must be placed and connected to all 4 transistor terminals to enable the charging protection. In Method 2, the insertion of the lower-layer metal plates could be arbitrary because the transistor is already fully protected through the simultaneous protection of the 4 transistor terminals. The configurations, 550 and 650, in FIGS. 8(*d*) and 8(*f*) show the insertion of the probe pads at "a first metal layer" or the lowermost metal layer, $M_1$, and at "a third metal layer," My, in Methods 2 and 3, respectively, where 1<=Y<N and N is the layer number for the "fourth" or the uppermost metal layer.

In Method 1, the transistor terminals are all connected together by the fuses at the poly layer already and zapping off the fuses would mean that the PD protection is only performed one time before the fuse zap-off. In order to maintain the full protection for the non-charging-monitoring non-reference transistor test structures from $M_1$ all the way to bond pad level, only end-of-line (EOL) measurement at the end of the fabrication process for the transistor test structures is allowed and the fuses are zapped off before the measurement. Thus, in-line probe pads are not necessary when Method 1 is used. The same conclusion is also true for the Method 1 of the non-reference transistor test structures for charging-monitoring application and if the similar method is used for reference transistor test structures which can be shared for both charging- and non-charging-monitoring applications.

Furthermore, in the three methods above for non-charging-monitoring non-reference transistor test structures, if the $M_1$ bond pads are already inserted in, inserting more bond pads at the upper metal layers between the top metal layer and the $M_1$ layer would only further lower the transistor terminal-to-substrate impedances and further better protect the top-metal-layer bond pad from the charging effect. (Note that when these inserted bond pads relative to their connected terminal are all fully-overlapped, the overall protection effectiveness may remain the same as that when only the $M_1$ bond pads are inserted. This is because under such circumstance, the overall terminal-to-substrate impedance remains the same as that when only $M_1$ bond pads are inserted. The protection effectiveness will be further enhanced if these inserted bond pads relative to their connected terminal are partially-overlapped or non-overlapped, which would in turn further reduce the terminal-to-substrate impedance.

It is noted here that the $M_1$ or lower-layer gate bond pad inserted has nearly no effect on the gate potential in Method 1 as indicated by $V_G$ in FIG. 3(*b*) because the gate potential is dominantly controlled by the PD and therefore maintained at a relatively low value. However, it does not hurt to leave these lower-layer gate bond pads there due to simplicity and consistency in the layout design for the test structures.

Thus, for the non-charging-monitoring application, if Method 2 or Method 3 is adopted, all inline probe pads at all the metal layers below the top-metal layer and at all the transistor terminals can be designed in for the transistor test structures if the global turn-off method for PD is implemented to enable the measurement for the transistor. This would facilitate inline transistor health monitoring at the end of the metal patterning steps for all the metal layers.

Figure 9A:
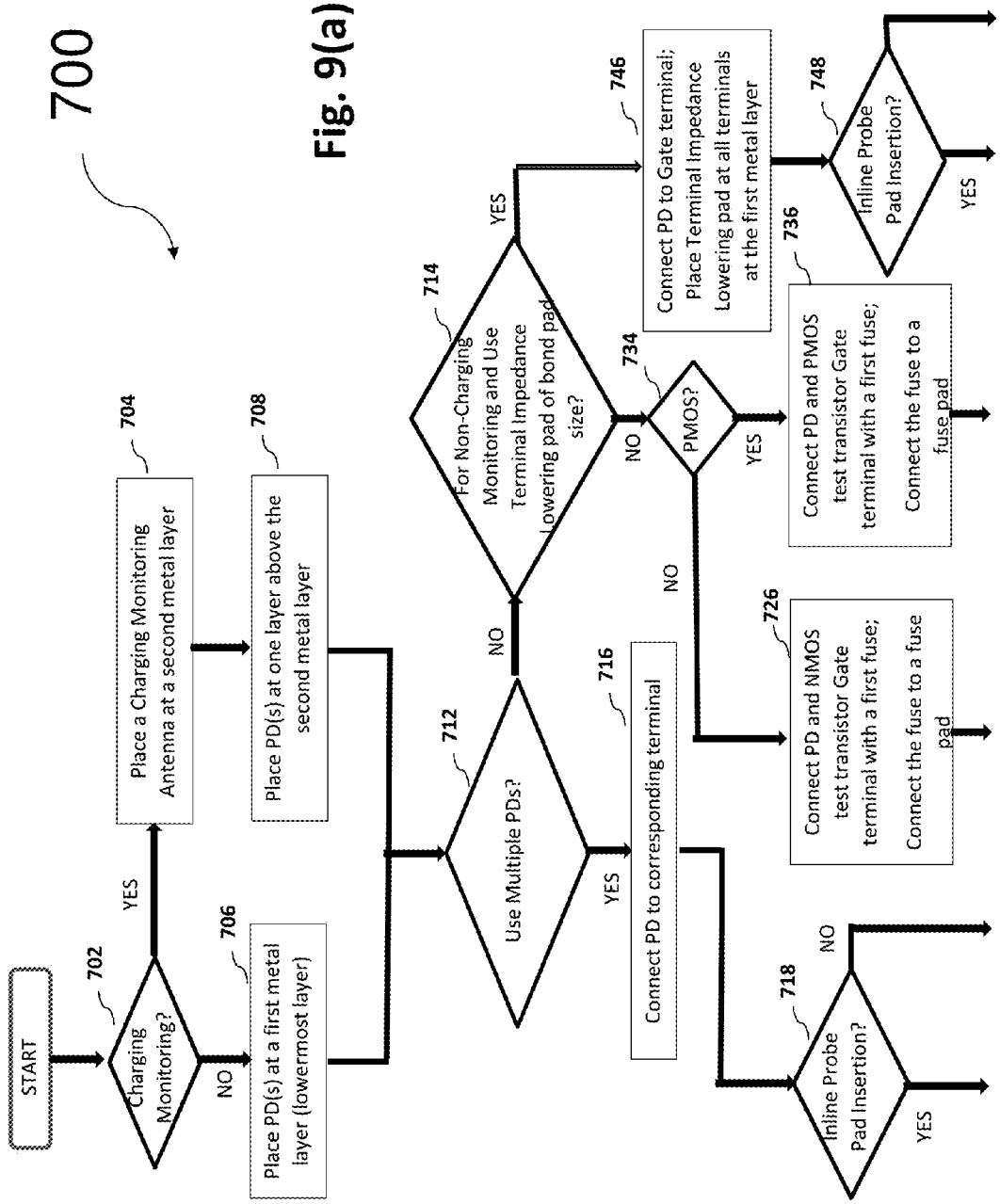
FIGS. 9(a) and 9(b) are block diagrams showing how the transistor test structures with the disclosed bond-pad protection methods are built based on manufacturing flow according to one embodiment of the present disclosure.
Figure 9B:
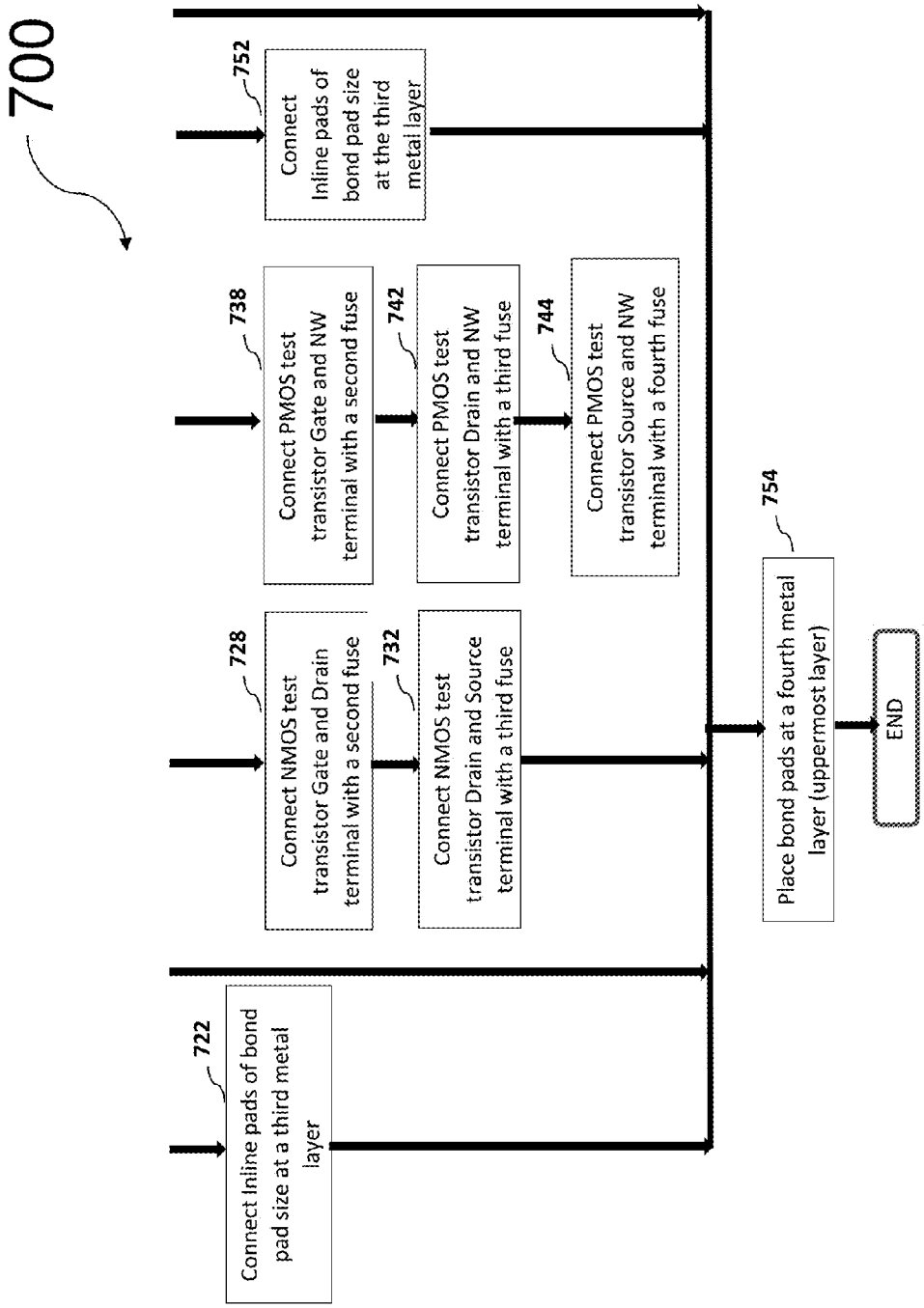

FIG. 9 is the block diagram 700 showing what and how the transistor test structure with different bond pad charging protection methods for charging- and non-charging-monitoring applications are built after the transistor formation step based on the manufacturing flow.

Step 702 first determines whether the transistor test structure is used for charging monitoring application. If the transistor test structure is not for charging monitoring application, protection device(s) is placed at a first metal layer which is the lowermost metal layer at step 706. If the transistor test structure is for charging monitoring application, a charging-monitoring antenna is placed at a second metal layer at step 704 and protection device(s) is placed at one layer above this second metal layer at step 708. Another step 712 determines whether multiple protection devices are to be employed. If multiple protection devices are to be employed, the process 700 may further including connecting each of the multiple protection devices to its corresponding transistor terminal at step 716. The process 700 may further checking whether the inline probe pads need to be inserted at step 718. If so, the process 700 may include connecting the inline probe pads of the bond pad size at a third metal layer at step 722. The process 700 may then moves to step 754 to place the bond pads at a fourth metal layer which is the uppermost metal layer.

Referring back to step 712, if a single protection device is to be employed, step 714 may determine whether the transistor test structure is for non-charging-monitoring application with the terminal impedance-lowering pad at all transistor terminals at the first metal layer. If not, the process 700 may further include checking whether the transistor test structure is PMOS or NMOS at step 734. If it is not PMOS, the protection device may be connected to the NMOS transistor gate terminal with a first fuse and connecting the first fuse to a fuse pad (step 726), the transistor gate terminal and drain terminal may be connected with a second fuse (step 728), the transistor drain terminal and source terminal may be connected with a third fuse (step 732). In the case that the PMOS is used, the process 700 also include connecting the protection device to the PMOS transistor gate terminal with a first fuse and connecting the first fuse to a fuse pad (step 736), connecting the PMOS transistor gate terminal and NW terminal with a second fuse (step 738), connecting the PMOS transistor drain terminal and NW terminal with a third fuse (step 742), and connecting the PMOS transistor source terminal and NW terminal with a fourth fuse (step 744). The process 700 may proceed to step 754 to place the bond pads at the fourth metal layer which is the uppermost metal layer.

When the determination in step 714 comes back positive the process 700 may further include connecting the single protection device to the transistor gate terminal and placing the terminal impedance-lowering pad at all transistor terminal at the first metal layer at step 746. At step 748, the process 700 may further determine whether inline probe pads need to be inserted. If the inline pads are required, the process 700 may further include connecting the inline probe pads of the bond pad size at the third metal layer at step 752. The process 700 may proceed to step 754 to place the bond pads at the fourth metal layer which is the uppermost metal layer in the current embodiment.

The tables shown in FIGS. 10(*a*) and (*b*) summarize the methods for the non-reference transistor test structures for charging- and non-charging-monitoring applications, respectively, in terms of the location of the metal antenna, the total number of the protection devices, which metal layer and transistor terminal the protection device is connected, the total number of fuses and fuse pads used, whether the global PD turn-off scheme is allowed, the total number of the TIL pads used, which metal layer and transistor terminal the TIL pad is connected, whether inline the probe pad is allowed and if allowed, the location of the inline probe pad, etc.

Since the reference transistor test structures for both the charging- and non-charging-monitoring applications are protected from the $M_1$ layer and above to rid off the impact of any charging effect, the present disclosure could meet the need for the reference transistor test structures of both applications as well.

The methods concluded here based on P-MOSFET transistor test structures could be equally applicable to N-MOSFET transistor test structures as well. The effectiveness of these methods is expected to be similar for the two transistor types.

Finally, these identified methods above, though demonstrated here by the transistor test structures with traditional gate oxides, could be applicable to the transistor test structures with high-K metal-gate (HKMG) gate oxides as well because similar conclusion on the protection effectiveness can be drawn by the simulation experiments where the characteristics of the traditional gate oxides are replaced by those of HKMG gate oxides.

The present disclosure may be practiced as a software invention, implemented in the form of a machine-readable medium having stored thereon at least one sequence of instructions that, when executed, causes a machine to effect the present disclosure. With respect to the term "machine," such term should be construed broadly as encompassing all types of machines, e.g., a non-exhaustive listing including: computing machines, non-computing machines, communication machines, etc. Similarly, with respect to the term "machine-readable," such term should be construed broadly as encompassing a broad spectrum of mediums, e.g., a non-exhaustive listing including: magnetic medium (floppy disks, hard disks, magnetic tapes, etc.), optical medium (CD-ROMs, DVD-ROMs, etc.), flash-based medium (EPROM Flash memories, EPROM Flash hard disks, etc.), etc.

Some modifications of these examples, as well as other possibility will, on reading or having read this description, or having comprehended these examples, will occur to those skilled in the art. Such modifications and variations are comprehended within this disclosure as described here and claimed below. The description above illustrates only a relative few specific embodiments and examples of the present disclosure. The present disclosure, indeed, does include various modifications and variations made to the structures and operations described herein, which still fall within the scope of the present disclosure as defined in the following claims.

What is claimed is:

1. A method for preparing a non-reference transistor test structure having multiple terminals, comprising:
   when an intended application of the non-reference transistor test structure is not for monitoring a plasma-involved charging, employing a protection mechanism by placing a MOSFET-based gated diode at a first metal layer, wherein the first metal layer is a lowermost metal layer; and
   when the intended application of the non-reference transistor test structure is for monitoring a plasma-involved charging, placing a charging monitoring antenna at a second metal layer; and employing the protection mechanism by placing the MOSFET-based gated diode at one metal layer above the second metal layer.

2. The method according to claim 1, further comprising:
   when more than one MOSFET-based gated diode is employed, connecting the MOSFET-based gated diode to the corresponding terminal, regardless of whether the intended application of the non-reference transistor test structure is for monitoring the plasma-involved charging or not; or
   when only one MOSFET-based gated diode is employed and the intended application of the non-reference transistor test structure is not for monitoring the plasma-involved charging, connecting the MOSFET-based gated diode to the gate terminal and placing an impedance-lowering metal pad for each of the terminals at the first metal layer; or
   when only one MOSFET-based gated diode is employed and without placement of the impedance-lowering metal pad for each of the terminals at the first metal layer regardless of whether the intended application of the non-reference transistor test structure is for monitoring the plasma-involved charging or not:
   for a PMOS non-reference transistor test structure having a gate terminal, a drain terminal, a source terminal, and a N-Well terminal, connecting the MOSFET-based gated diode and the gate terminal with a first fuse connecting to a first fuse pad, connecting the gate terminal and the N-Well terminal with a second fuse, connecting the drain terminal and the N-Well terminal with a third fuse, and connecting the source terminal and the N-Well terminal with a fourth fuse; and
   for a NMOS non-reference transistor test structure having a gate terminal, a source terminal, and a drain terminal, connecting the MOSFET-based gated diode and the gate terminal with the first fuse connecting to the first fuse pad, connecting the gate terminal and the drain terminal with the second fuse, and connecting the drain terminal and the source terminal with the third fuse.

3. The method according to claim 2, further comprising placing a bond pad for each of the terminals at a fourth metal layer, wherein the fourth metal layer is an uppermost metal layer.

4. The method according to claim 3, further comprising setting the size of the impedance-lowering pad to the same with the size of the bond pad.

5. The method according to claim 2, when more than one MOSFET-based gated diode is employed, further comprising applying a global turn-off method for the MOSFET-based gated diodes before performing measurement for charging performance evaluation.

6. The method according to claim 2, when only one MOSFET-based gated diode is employed and without the placement of the impedance-lowering metal pad for each of the terminals at a third metal layer, further comprising applying an electrical bias to evaporate fuses before performing measurement for charging performance evaluation.

7. The method according to claim 2 when more than one MOSFET-based gated diode is employed, further comprising:
   placing an inline probe pad for each of the terminals at the third metal layer which is at least one metal layer below an uppermost metal layer when the intended application of the non-reference transistor test structure is not for monitoring the plasma-involved charging; or
   placing an inline probe pad for each of the terminals at the third metal layer which is at least one metal layer above the second metal layer and below the uppermost metal layer when the intended application of the non-reference transistor test structure is for monitoring the plasma-involved charging.

8. The method according to claim 2, when only one MOSFET-based gated diode together with the impedance-lowering metal pad for each of the terminals is employed, further comprising:
   placing an inline probe pad for each of the terminals at least one metal layer above the first metal layer when the intended application of the non-reference transistor test structure is not for monitoring the plasma-involved charging.

9. A non-reference transistor test structure having multiple terminals, comprising:
when an intended application of the non-reference transistor test structure is not for monitoring a plasma-involved charging a protection mechanism having a MOSFET-based gated diode at a first metal layer, wherein the first metal layer is a lowermost metal layer; and
when the intended application of the non-reference transistor test structure is for monitoring a plasma-involved charging a charging monitoring antenna at a second metal layer, and the protection mechanism having the MOSFET-based gated diode at one metal layer above the second metal layer.

10. The structure according to claim 9, wherein when more than one MOSFET-based gated diode is employed, the MOSFET-based gated diode is connected to the corresponding terminal, regardless of whether the intended application of the non-reference transistor test structure is for monitoring the plasma-involved charging or not.

11. The structure according to claim 9, wherein when only one MOSFET-based gated diode is employed and the intended application of the non-reference transistor test structure is not for monitoring the plasma-involved charging, the MOSFET-based gated diode is connected to the gate terminal and an impedance-lowering metal pad for each of the terminals at the first metal layer is placed.

12. The structure according to claim 11, wherein when only one MOSFET-based gated diode is employed and the impedance-lowering metal pad for each of the terminals at the first metal layer regardless of whether the intended application of the non-reference transistor test structure is for monitoring the plasma-involved charging or not is not disposed:
for a PMOS non-reference transistor test structure having a gate terminal, a drain terminal, a source terminal, and a N-Well terminal, the MOSFET-based gated diode and the gate terminal are connected with a first fuse connecting to a first fuse pad, the gate terminal and the N-Well terminal are connected with a second fuse, the drain terminal and the N-Well terminal are connected with a third fuse, and the source terminal and the N-Well terminal are connected with a fourth fuse; and
for a NMOS non-reference transistor test structure having a gate terminal, a source terminal, and a drain terminal, the MOSFET-based gated diode and the gate terminal are connected with the first fuse connecting to the first fuse pad, the gate terminal and the drain terminal are connected with the second fuse, and the drain terminal and the source terminal are connected with the third fuse.

13. The structure according to claim 11, further comprising a bond pad placed at a fourth metal layer, wherein the fourth metal layer is an uppermost metal layer.

14. The structure according to claim 12, wherein the size of the impedance-lowering pad is the same with the size of the bond pad.

15. The structure according to claim 11, when more than one MOSFET-based gated diode is employed, further comprising having a global turn-off method for the MOSFET-based gated diode incorporated before performance of measurement for charging performance evaluation.

16. The structure according to claim 11, when only one MOSFET-based gated diode is employed and without the placement of the impedance-lowering metal pad for each of the terminals at a third metal layer fuses thereof are evaporated by an electrical bias before performance of measurement for charging performance evaluation.

17. The structure according to claim 11, when more than one MOSFET-based gated diode is employed, further comprising an inline probe pad for each of the terminals at the third metal layer which is at least one metal layer below an uppermost metal layer when the intended application of the non-reference transistor test structure is not for monitoring the plasma-involved charging.

18. The structure according to claim 16, further comprising an inline probe pad for each of the terminals at the third metal layer which is at least one metal layer above the second metal layer and below the uppermost metal layer when the intended application of the non-reference transistor test structure is for monitoring the plasma-involved charging.

19. The structure according to claim 11, when only one MOSFET-based gated diode together with an impedance-lowering metal pad for each of the terminals is employed, further comprising an inline probe pad for each of the terminals at least one metal layer above the first metal layer when the intended application of the non-reference transistor test structure is not for monitoring the plasma-involved charging.

* * * * *